(12) United States Patent
Cook et al.

(10) Patent No.: US 11,676,880 B2
(45) Date of Patent: Jun. 13, 2023

(54) HIGH THERMAL CONDUCTIVITY VIAS BY ADDITIVE PROCESSING

(71) Applicant: Texas Instruments Incorporated, Dallas, TX (US)

(72) Inventors: Benjamin Stassen Cook, Rockwall, TX (US); Archana Venugopal, Dallas, TX (US); Luigi Colombo, Dallas, TX (US); Robert Reid Doering, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 15/361,399

(22) Filed: Nov. 26, 2016

(65) Prior Publication Data

US 2018/0151471 A1 May 31, 2018

(51) Int. Cl.
*H01L 23/48* (2006.01)
*H01L 23/52* (2006.01)
(Continued)

(52) U.S. Cl.
CPC ...... *H01L 23/3677* (2013.01); *H01L 21/4882* (2013.01); *H01L 23/3731* (2013.01); *H01L 23/3733* (2013.01); *H01L 23/3736* (2013.01)

(58) Field of Classification Search
CPC ........... H01L 21/4882; H01L 21/76801; H01L 21/76877; H01L 23/3733; H01L 23/5226;
(Continued)

(56) References Cited

U.S. PATENT DOCUMENTS

| 5,224,030 A | 6/1993 | Banks et al. |
| 5,481,136 A | 1/1996 | Kohmoto et al. |

(Continued)

FOREIGN PATENT DOCUMENTS

| CN | 105419345 | 3/2016 |
| EP | 2388810 | 11/2011 |

(Continued)

OTHER PUBLICATIONS

Sabine Szunerits, et al.; "Diamond Nanowires: A Novel Platform for Electrochemistry and Matrix-Free Mass Spectrometry"; Sensors; ISSN 1424-8220; www.mdpi.com/journal/sensors; Apr. 19, 2015; Published: May 27, 2015; pp. 12573-12593.

(Continued)

*Primary Examiner* — Caleb E Henry
*Assistant Examiner* — Dilinh P Nguyen
(74) *Attorney, Agent, or Firm* — Andrew R. Ralston; Frank D. Cimino

(57) ABSTRACT

An integrated circuit has a substrate and an interconnect region disposed on the substrate. The interconnect region includes a plurality of interconnect levels. Each interconnect level includes interconnects in dielectric material. The integrated circuit includes a thermal via in the interconnect region. The thermal via extends vertically in at least one of the interconnect levels in the interconnect region. The thermal via includes a cohered nanoparticle film in which adjacent nanoparticles are cohered to each other. The thermal via has a thermal conductivity higher than dielectric material touching the thermal via. The cohered nanoparticle film is formed by a method which includes an additive process.

24 Claims, 22 Drawing Sheets

FIG. 2B

(51) Int. Cl.
*H01L 23/367* (2006.01)
*H01L 23/373* (2006.01)
*H01L 21/48* (2006.01)

(58) Field of Classification Search
CPC ... H01L 24/05; H01L 24/06; H01L 21/76879;
H01L 23/367; H01L 23/522; H01L
21/32051; H01L 21/32055; H01L 21/324;
H01L 21/76895; H01L 23/3735; H01L
23/481; H01L 23/528; H01L 23/53276;
H01L 27/0248; H01L 23/10; H01L 23/34;
H01L 23/36; H01L 23/4012; H01L
23/49568; H01L 2023/4018; H01L
2023/4025; H01L 2023/4034
USPC .......................................... 257/758, 377, 774
See application file for complete search history.

(56) References Cited

U.S. PATENT DOCUMENTS

| | | |
|---|---|---|
| 5,683,939 A | 11/1997 | Schrantz et al. |
| 6,046,503 A | 4/2000 | Weigand et al. |
| 6,100,199 A | 8/2000 | Joshi et al. |
| 6,242,807 B1 | 6/2001 | Kazami |
| 6,265,771 B1 | 7/2001 | Ference et al. |
| 6,288,426 B1 | 9/2001 | Gauthier, Jr. et al. |
| 6,646,340 B2 | 11/2003 | Deeter et al. |
| 6,771,502 B2 | 8/2004 | Getz, Jr. et al. |
| 6,773,952 B2 | 8/2004 | Armbrust et al. |
| 6,800,886 B2 | 10/2004 | Awano |
| 7,071,603 B2 | 7/2006 | Ha et al. |
| 7,161,239 B2 | 1/2007 | Zhao et al. |
| 7,189,778 B2 | 3/2007 | Tobita et al. |
| 7,260,939 B2 | 8/2007 | Weaver, Jr. |
| 7,264,869 B2 | 9/2007 | Tobita et al. |
| 7,286,359 B2 | 10/2007 | Khbeis et al. |
| 7,312,531 B2 | 12/2007 | Chang et al. |
| 7,345,364 B2 | 3/2008 | Kerr et al. |
| 7,473,633 B2 | 1/2009 | Furukawa et al. |
| 7,560,310 B2 | 7/2009 | Hsu et al. |
| 7,572,680 B2 | 8/2009 | Hess et al. |
| 7,582,962 B1 | 9/2009 | Pavio |
| 7,586,191 B2 | 9/2009 | Hall et al. |
| 7,633,152 B2 | 12/2009 | Lee et al. |
| 7,642,641 B2 | 1/2010 | Mahler et al. |
| 7,763,973 B1 | 7/2010 | Bratkovski |
| 7,773,973 B2 | 7/2010 | Bratkovski et al. |
| 7,768,121 B2 | 8/2010 | Colgan et al. |
| 7,772,692 B2 | 8/2010 | Takamatsu et al. |
| 7,825,498 B2 | 11/2010 | Haga et al. |
| 7,859,087 B2 | 12/2010 | Murata et al. |
| 7,989,349 B2 | 8/2011 | Sandhu et al. |
| 8,022,532 B2 | 9/2011 | Kasuya et al. |
| 8,106,497 B2 | 1/2012 | Brunnbauer |
| 8,130,500 B2 | 3/2012 | Oda |
| 8,134,231 B2 | 3/2012 | Sano et al. |
| 8,148,820 B2 | 4/2012 | Sato |
| 8,248,803 B2 | 8/2012 | Lin et al. |
| 8,277,613 B2 | 10/2012 | Smith |
| 8,410,474 B2 | 4/2013 | Okai et al. |
| 8,440,999 B2 | 5/2013 | Dimitrakopoulos et al. |
| 8,462,511 B2 | 6/2013 | Lee |
| 8,466,054 B2 | 6/2013 | Stuber et al. |
| 8,470,701 B2 | 6/2013 | Rogers et al. |
| 8,486,824 B2 | 7/2013 | Tee et al. |
| 8,524,539 B2 | 9/2013 | Lee et al. |
| 8,535,758 B2 | 9/2013 | Bulovic |
| 8,552,554 B2 | 10/2013 | Tain et al. |
| 8,558,372 B2 | 10/2013 | Negoro |
| 8,587,064 B2 | 11/2013 | Warabino |
| 8,637,388 B2 | 1/2014 | Abou-khalil et al. |
| 8,664,759 B2 | 3/2014 | Ryan |
| 8,836,110 B2 | 9/2014 | Chopin et al. |
| 8,865,577 B2 | 10/2014 | Wei |
| 8,866,276 B2 | 10/2014 | Su et al. |
| 8,866,294 B2 | 10/2014 | Pagaila et al. |
| 8,901,613 B2 | 12/2014 | Sekar et al. |
| 8,937,376 B2 | 1/2015 | Tsai |
| 8,940,628 B2 | 1/2015 | Yamazaki et al. |
| 9,013,035 B2 | 4/2015 | Zhao et al. |
| 9,093,428 B2 | 7/2015 | Liang |
| 9,099,375 B2 | 8/2015 | Kub et al. |
| 9,165,721 B2 | 10/2015 | Lee et al. |
| 9,171,779 B2 | 10/2015 | Lin et al. |
| 9,245,813 B2 | 1/2016 | Bartley et al. |
| 9,308,731 B2 | 4/2016 | Williams |
| 9,331,283 B2 | 5/2016 | Lim et al. |
| 9,349,838 B2 | 5/2016 | Cheng et al. |
| 9,349,975 B2 | 5/2016 | Coe-sullivan et al. |
| 9,362,198 B2 | 6/2016 | Viswanathan |
| 9,397,023 B2 | 7/2016 | Venugopal et al. |
| 9,401,315 B1 | 7/2016 | Bodenweber |
| 2001/0035578 A1 | 11/2001 | Liang et al. |
| 2003/0064017 A1 | 4/2003 | Tobita et al. |
| 2003/0122215 A1 | 7/2003 | Wilson |
| 2004/0102597 A1 | 5/2004 | Tobita et al. |
| 2005/0079120 A1 | 4/2005 | Fujita et al. |
| 2005/0133863 A1 | 6/2005 | Werner et al. |
| 2006/0121710 A1 | 6/2006 | Liang et al. |
| 2006/0289988 A1 | 12/2006 | Rayn |
| 2007/0001292 A1 | 1/2007 | Ohta et al. |
| 2007/0126116 A1 | 6/2007 | Dangelo et al. |
| 2007/0148972 A1 | 6/2007 | Hara et al. |
| 2008/0047484 A1 | 2/2008 | Sung |
| 2008/0266787 A1 | 10/2008 | Gosset et al. |
| 2009/0162954 A1 | 6/2009 | Griffin et al. |
| 2009/0218682 A1 | 9/2009 | Lundberg |
| 2009/0273068 A1 | 11/2009 | Kaskoun et al. |
| 2010/0140790 A1 | 6/2010 | Setiadi et al. |
| 2010/0148357 A1 | 6/2010 | Yang et al. |
| 2010/0207277 A1 | 8/2010 | Bauer et al. |
| 2011/0039357 A1 | 2/2011 | Lin et al. |
| 2011/0140232 A1 | 6/2011 | Gaul et al. |
| 2011/0260303 A1 | 10/2011 | Pagaila et al. |
| 2011/0272824 A1 | 11/2011 | Pagaila |
| 2012/0025269 A1 | 2/2012 | Parkhurst et al. |
| 2012/0042922 A1 | 2/2012 | Kondo et al. |
| 2012/0086132 A1 | 4/2012 | Kim et al. |
| 2012/0141678 A1 | 6/2012 | Sumerel |
| 2013/0127037 A1 | 5/2013 | Mori et al. |
| 2013/0160701 A1 | 6/2013 | Arnold et al. |
| 2014/0008756 A1 | 1/2014 | Pei et al. |
| 2014/0014975 A1 | 1/2014 | Bae et al. |
| 2014/0015158 A1* | 1/2014 | Cola ............... B01J 23/745 |
| | | 264/81 |
| 2014/0057393 A1 | 2/2014 | Bonart |
| 2014/0106508 A1 | 4/2014 | Sutardja et al. |
| 2014/0131860 A1 | 5/2014 | Kanda et al. |
| 2014/0321026 A1 | 10/2014 | Hermann et al. |
| 2014/0321093 A1 | 10/2014 | Pande et al. |
| 2015/0008525 A1 | 1/2015 | Fukuzaki et al. |
| 2015/0084103 A1 | 3/2015 | Okazaki et al. |
| 2015/0129190 A1 | 5/2015 | Lin |
| 2015/0136357 A1 | 5/2015 | Johnson |
| 2015/0137307 A1 | 5/2015 | Stuber |
| 2015/0152239 A1 | 6/2015 | Guilera Grandes et al. |
| 2015/0159969 A1 | 6/2015 | Lu et al. |
| 2015/0162346 A1 | 6/2015 | Choi et al. |
| 2015/0166921 A1 | 6/2015 | Erdemir et al. |
| 2015/0187678 A1 | 7/2015 | Park et al. |
| 2015/0218694 A1 | 8/2015 | Xu et al. |
| 2015/0228628 A1 | 8/2015 | Pagaila et al. |
| 2015/0237762 A1 | 8/2015 | Holt et al. |
| 2015/0249126 A1* | 9/2015 | Kataoka ............ H01L 29/66659 |
| | | 257/343 |
| 2015/0255451 A1 | 9/2015 | Yasusaka |
| 2015/0270356 A1 | 9/2015 | Palacios et al. |
| 2015/0315442 A1 | 11/2015 | Hofius |
| 2015/0325524 A1 | 11/2015 | Wada et al. |
| 2015/0325531 A1 | 11/2015 | Dyer et al. |
| 2015/0348865 A1 | 12/2015 | Vincent et al. |
| 2016/0027717 A1 | 1/2016 | Jang et al. |
| 2016/0152794 A1 | 6/2016 | Diaham et al. |

(56) References Cited

U.S. PATENT DOCUMENTS

| | | | |
|---|---|---|---|
| 2016/0197027 A1 | 7/2016 | Nasser-faili | |
| 2016/0215172 A1 | 7/2016 | Morita et al. | |
| 2016/0291256 A1 | 10/2016 | Rollinger | |
| 2016/0329343 A1* | 11/2016 | Pachamuthu | H01L 27/1157 |
| 2016/0379960 A1* | 12/2016 | Huang | H01L 25/0657 |
| | | | 257/432 |
| 2016/0380090 A1 | 12/2016 | Roberts et al. | |
| 2017/0338214 A1 | 11/2017 | Uzoh et al. | |

FOREIGN PATENT DOCUMENTS

| | | |
|---|---|---|
| JP | 2002088257 | 3/2002 |
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Awano et al., Carbon Nanotubes for VLSI: Interconnect and Transistor Applications—2010, Proceedings of the IEEE, vol. 98, No. 12, pp. 2015-2031.

Sato et al., "Growth of diameter-controlled carbon nanotubes using monodisperse nicket nanoparticles obtained with a differential mobility analyzer"—2003, Chemical Phys. Lett. 382 (2003) 361-366.

International Search Report for PCT/US2017/063136 dated Apr. 5, 2018.

International Search Report for PCT/US2017/063131 dated Apr. 19, 2018.

Extended European Search Report for 17874089.0; dated Nov. 25, 2019; 9 pages.

Extended European Search Report for 17874052.8; dated Nov. 25, 2019; 9 pages.

Cross Referenced from U.S. Appl. No. 17/114,219, Non-Final Office Action dated May 12, 2022, pp. 8.

* cited by examiner

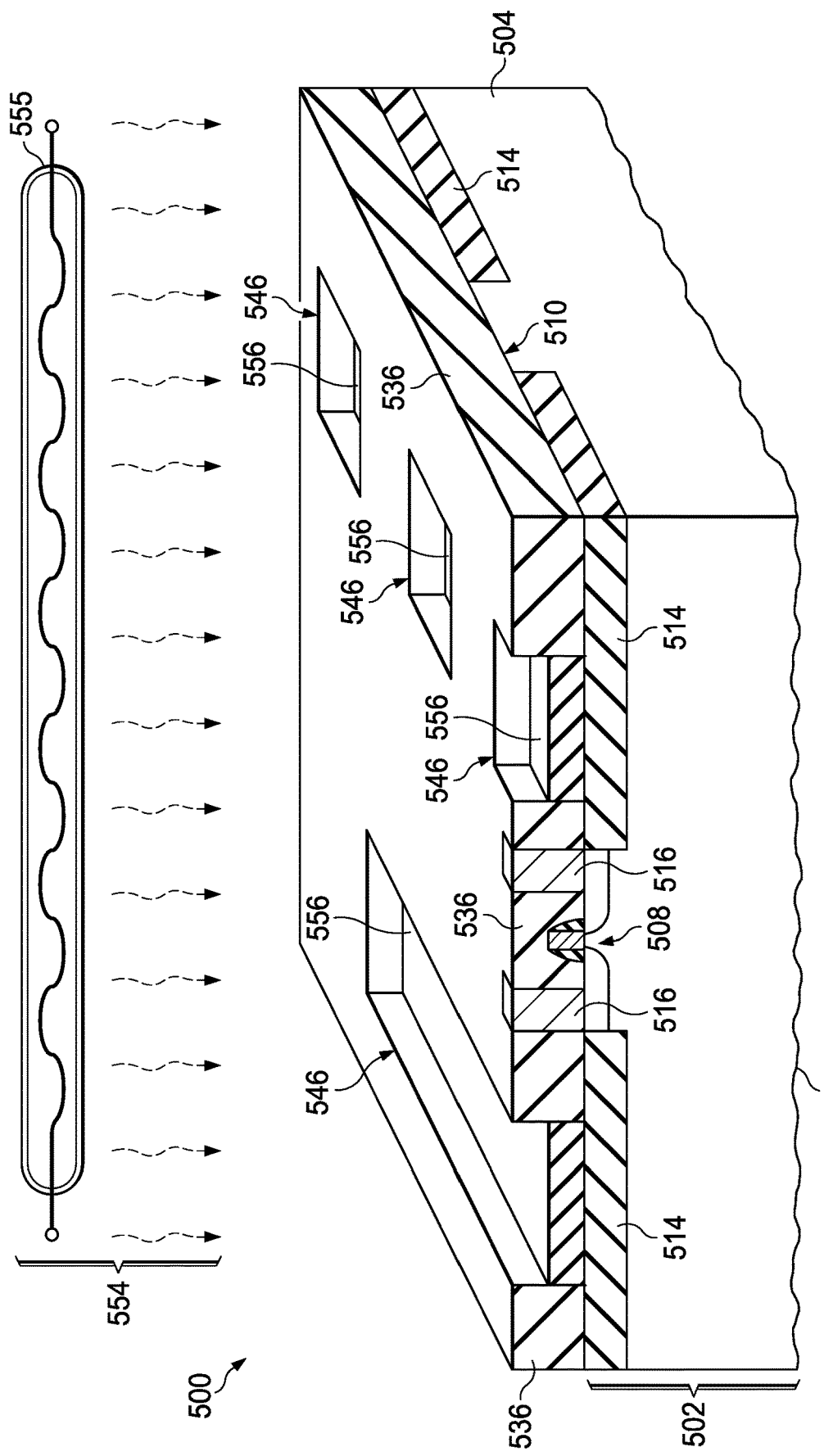

HIGH THERMAL CONDUCTIVITY VIAS BY ADDITIVE PROCESSING

FIELD OF THE INVENTION

This disclosure relates to the field of integrated circuits. More particularly, this disclosure relates to thermal management in integrated circuits.

BACKGROUND OF THE INVENTION

Integrated circuits frequently generate undesired heat in some active components. It is sometimes desired to remove the heat through a heat sink or other passive structure. It is sometimes desired to divert the heat from thermally sensitive components in the integrated circuit. Managing excess heat in integrated circuits has become increasingly problematic.

SUMMARY OF THE INVENTION

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit has a substrate and an interconnect region disposed on the substrate. The interconnect region includes a plurality of interconnect levels. Each interconnect level includes interconnects in dielectric material. The integrated circuit includes a thermal via in the interconnect region. The thermal via extends vertically in at least one of the interconnect levels in the interconnect region. The thermal via includes a cohered nanoparticle film in which adjacent nanoparticles are cohered to each other. The thermal via has a thermal conductivity higher than dielectric material touching the thermal via. The cohered nanoparticle film is formed by a method which includes an additive process.

DESCRIPTION OF THE VIEWS OF THE DRAWINGS

FIG. 5A through FIG. 5G depict an example method of forming an integrated circuit with thermal vias according to an embodiment of the invention.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following patent applications are related and hereby incorporated by reference: U.S. patent application Ser. Nos. 15/361,390; 15/361,394; 15/361,397; 15/361,401; and Ser. No. 15/361,403, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

Figure 1A:
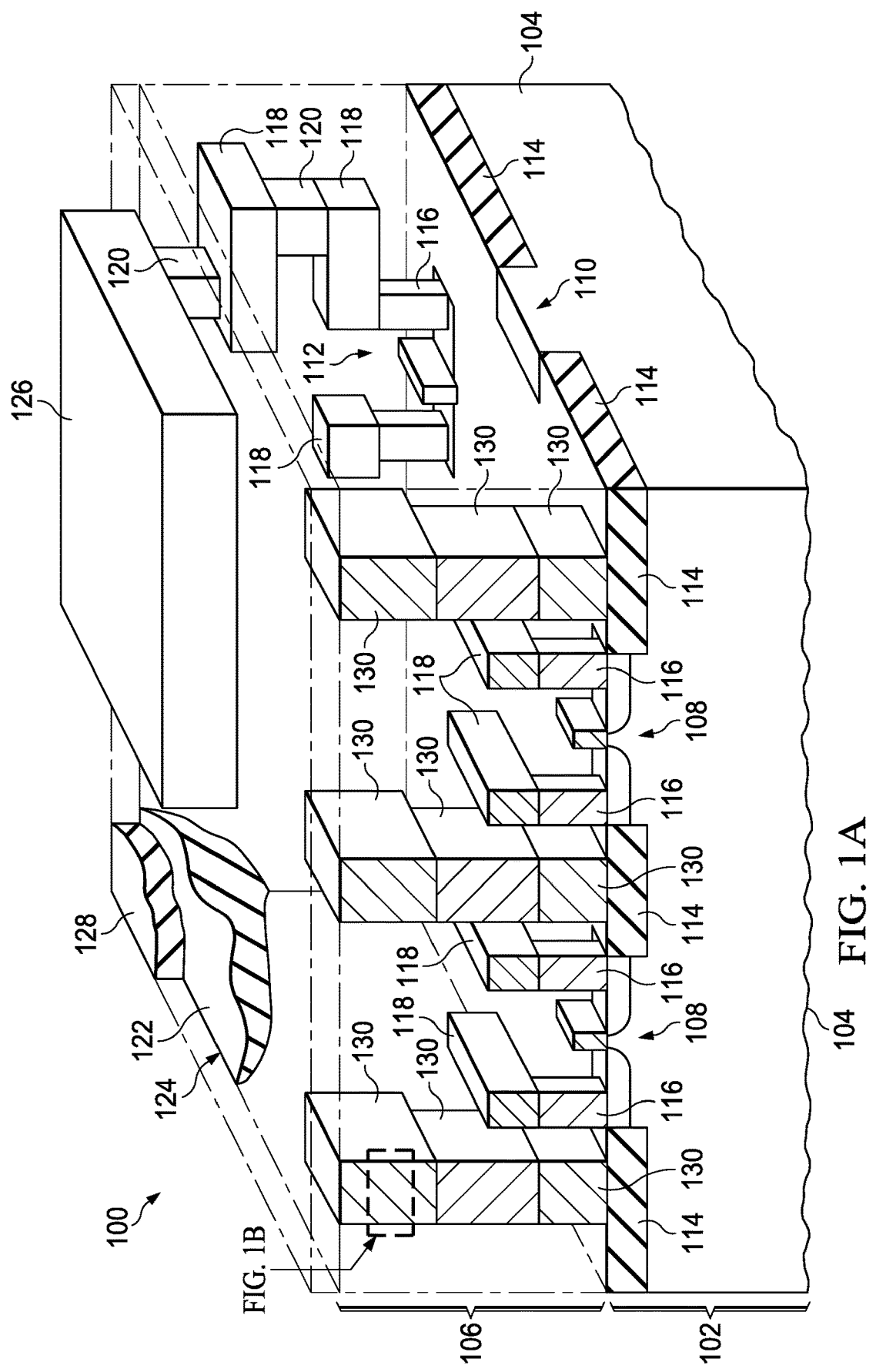
FIG. 1A and FIG. 1B are cross sections of an example integrated circuit containing a thermal via according to an embodiment of the invention.
Figure 1B:
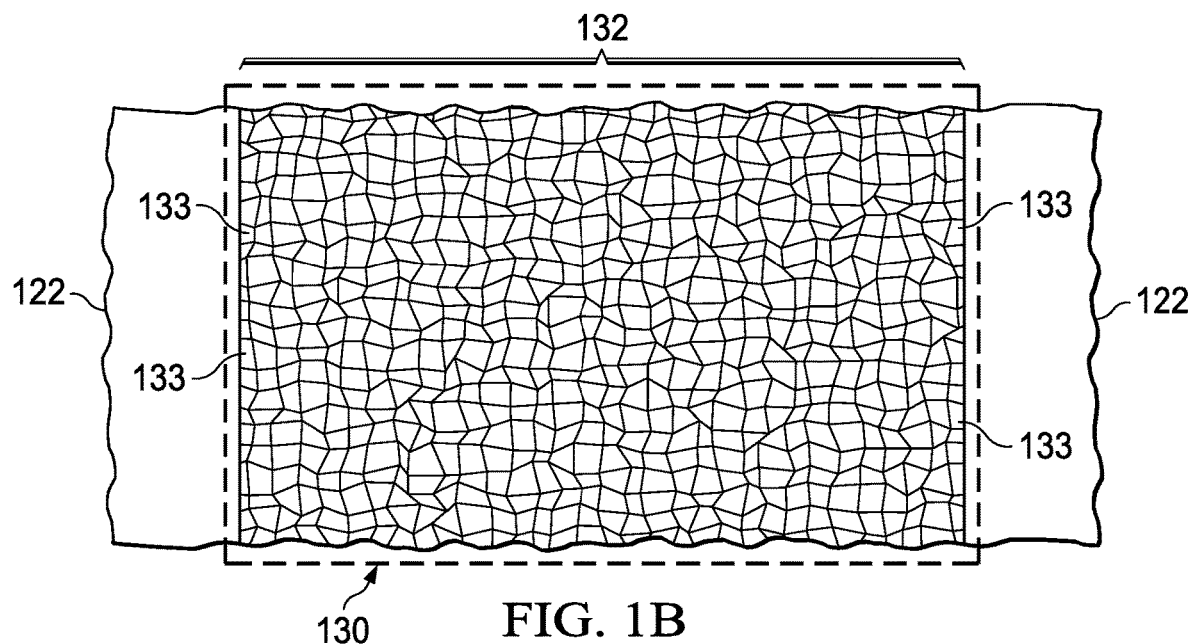

FIG. 1A and FIG. 1B are cross sections of an example integrated circuit containing a thermal via according to an embodiment of the invention. Referring to FIG. 1A, the integrated circuit 100 includes a substrate 102 comprising a semiconductor material 104 such as silicon, silicon germanium or silicon carbide. Alternatively, the semiconductor material 104 may be a type III-V semiconductor such as gallium nitride or gallium arsenide. Other semiconductor materials are within the scope of the instant example. The integrated circuit 100 further includes an interconnect region 106 disposed above the substrate 102. Heat-generating components 108 of the integrated circuit 100, depicted in FIG. 1A as metal oxide semiconductor (MOS) transistors, are disposed in the substrate 102, possibly extending into the interconnect region 106, proximate to a boundary 110 between the substrate 102 and the interconnect region 106. Other manifestations of the heat-generating components 108, such as bipolar junction transistors, junction field effect transistors (JFETs), resistors, and silicon controlled rectifiers (SCRs) are within the scope of the instant example. In the instant example, the integrated circuit 100 may also include thermally sensitive components 112, depicted in FIG. 1A as MOS transistors. Other manifestations of the thermally sensitive components 112 are within the scope of the instant example. The components 108 and 112 may be laterally separated by field oxide 114 proximate to the boundary 110 between the substrate 102 and the interconnect region 106. The field oxide 114 may have, for example, a shallow trench isolation (STI) structure as depicted in FIG. 1A, or may have a localized oxidation of silicon (LOCOS) structure.

The interconnect region 106 may include contacts 116, interconnects 118 and vias 120 disposed in a dielectric layer stack 122. The contacts 116 make electrical connections to the heat-generating components 108 and the thermally sensitive components 112. The interconnects 118 are disposed in a plurality of interconnect levels. The interconnects 118 in a first interconnect level make electrical connections to the contacts 116. The vias 120 are disposed between successive interconnect levels and make electrical connections to the interconnects. A top surface 124 of the interconnect region 106 is located at a surface of the interconnect region 106 opposite to the boundary 110 between the substrate 102 and the interconnect region 106. The interconnects 118 may include aluminum interconnects, damascene copper interconnects, and/or plated copper interconnects. An aluminum interconnect may include an aluminum layer with a few percent silicon, titanium, and/or copper, possibly on an adhesion layer comprising titanium, and possibly with an anti-reflection layer of titanium nitride on the aluminum layer. A damascene copper interconnect may include copper on a barrier layer of tantalum and/or tantalum nitride, disposed in a trench in the dielectric layer stack 122. A plated copper interconnect may include an adhesion layer at a bottom of the interconnect, and may have a barrier layer disposed on the sides of the interconnect. The dielectric layer stack 122 may include a pre-metal dielectric (PMD) layer directly over the substrate 102; the contacts 116 extend through the PMD layer. The dielectric layer stack 122 may also include a plurality of intra-metal dielectric (IMD) layers; each IMD layer laterally surrounds instances of the interconnects 118 in that specific interconnect level. The dielectric layer stack 122 may further include a plurality of inter-level dielectric (ILD) layers; each ILD layer vertically separates instances of the interconnects 118 in two sequential interconnect levels and laterally surrounds instances of the vias 120 which connect the interconnects 118 in the two sequential interconnect levels. Bond pad structures 126 may be disposed over the top surface 124 of the interconnect region 106, and may be electrically coupled to the interconnects 118. A protective overcoat 128 may be disposed over the top surface 124 of the interconnect region 106. The protective overcoat 128 may include one or more layers of dielectric material, such as silicon dioxide, silicon nitride, silicon oxide nitride, and/or polyimide.

Thermal vias 130 are disposed in the interconnect region 106, extending over a portion, but not all, of the integrated circuit 100 in the interconnect region 106. Each thermal via 130 extends vertically in at least one of the interconnect levels. The thermal vias 130 may be stacked vertically to form continuous vertical structures, as depicted in FIG. 1A. Other configurations of the thermal vias 130 are within the scope of the instant example. The thermal vias 130 have a higher thermal conductivity than dielectric material of the dielectric layer stack 122 which touches the thermal vias 130. Thermal conductivity may be understood as a property of a material, and may be expressed in units of watts/meter ° C. The thermal vias 130 include a cohered nanoparticle film 132 that includes primarily nanoparticles 133, shown in more detail in FIG. 1B. In a version of the instant example depicted in FIG. 1B, the cohered nanoparticle film 132 substantially fills the thermal vias 130. Adjacent nanoparticles 133 cohere to each other. There may be inorganic functional molecules, for example silane-based molecules comprising silicon and oxygen, on surfaces of the nanoparticles 133. The cohered nanoparticle film 132 is substantially free of organic binder material such as adhesive or polymer. The thermal vias 130 may extend from an area proximate to the heat-generating components 108 to the top surface 124 of the interconnect region 106, as shown in FIG. 1A. The thermal vias 130 may be configured so as to extend away from the thermally sensitive components 112, as shown in FIG. 1A, advantageously diverting heat from the heat-generating components 108 away from the thermally sensitive components 112 during operation of the integrated circuit 100.

In a version of the instant example as depicted in FIG. 1A and FIG. 1B, thermal vias 130 may be electrically non-conductive, and the nanoparticles 133 may include, for example, aluminum oxide, diamond, hexagonal boron nitride, cubic boron nitride, and/or aluminum nitride. In such a version, the thermal vias 130 may optionally touch the contacts 116, the interconnects 118, and/or the vias 120 without risking undesired electrical shunts, enabling more efficient collection of heat from the heat-generating components 108.

In another version of the instant example, the thermal vias 130 may be electrically conductive. In such a version, the nanoparticles 133 may include, for example, metal, graphene, graphene embedded in metal, graphite, graphitic carbon, and/or carbon nanotubes. Electrically conductive versions of the thermal vias 130 may be separated from the contacts 116, the interconnects 118, and the vias 120 by dielectric material of the dielectric layer stack 122.

In a further version of the instant example, the nanoparticles 133 may include metal, and the thermal vias 130 may include a layer of graphitic material on the cohered nanoparticle film 132. In such a version, the nanoparticles 133 may include, for example, copper, nickel, palladium, platinum, iridium, rhodium, cerium, osmium, molybdenum and/or gold. The graphitic material may include graphite, graphitic carbon, graphene, and/or carbon nanotubes or the like. In such a version, the thermal vias 130 are electrically conductive, and hence may be electrically isolated from the contacts 116, the interconnects 118, and the vias 120 by dielectric material of the dielectric layer stack 122.

Figure 2B:
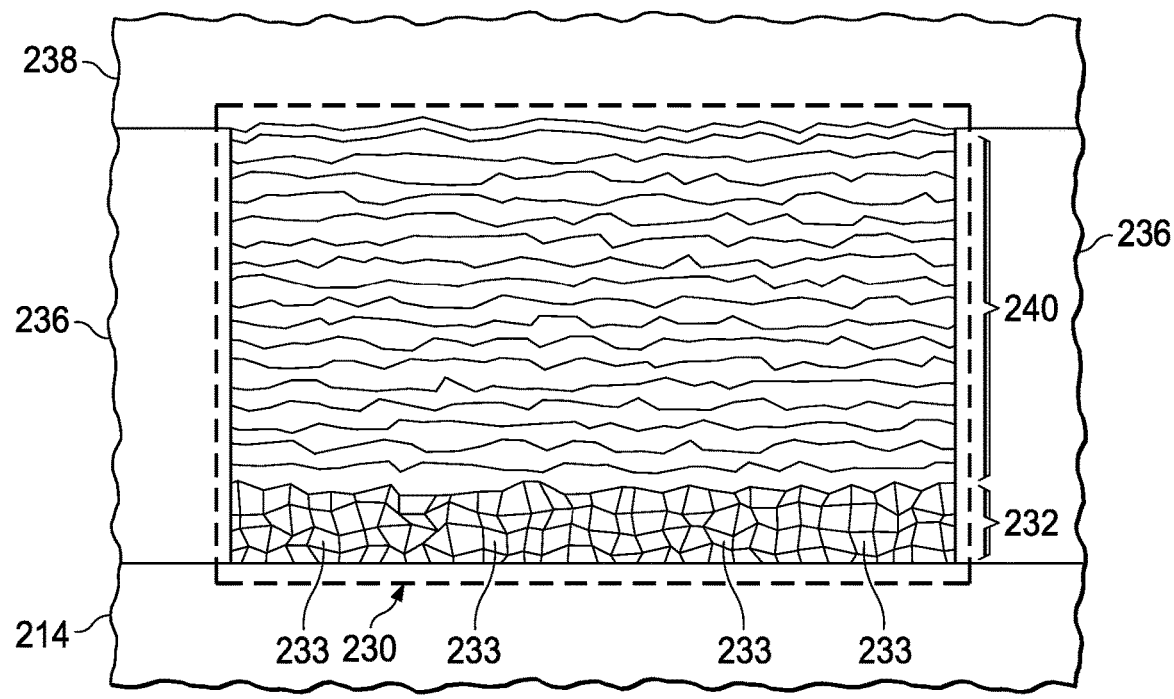
FIG. 2A and FIG. 2B are cross sections of another example integrated circuit containing a thermal via according to an embodiment of the invention.
Figure 2A:
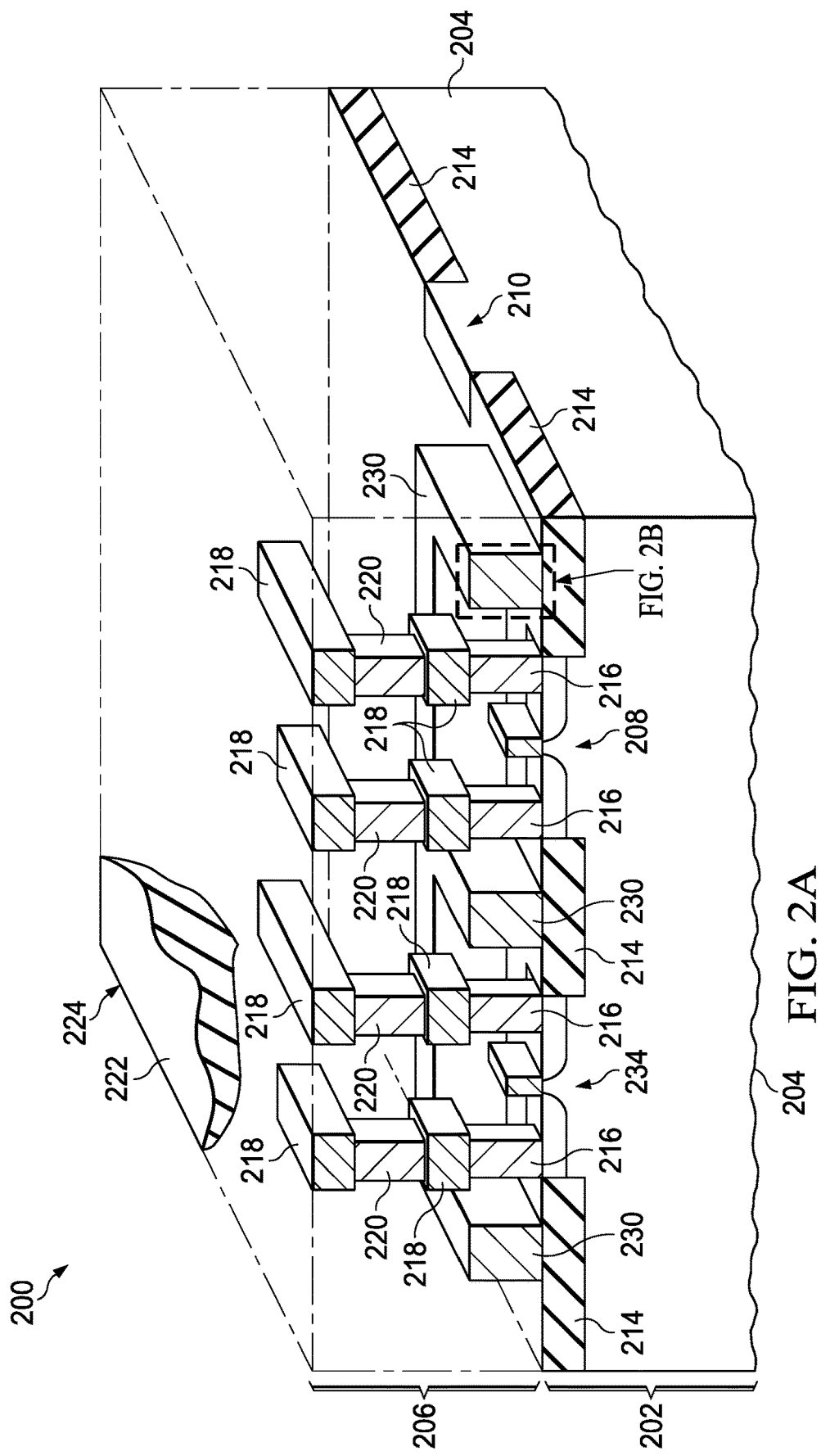

FIG. 2A and FIG. 2B are cross sections of another example integrated circuit containing a thermal via according to an embodiment of the invention. Referring to FIG. 2A, the integrated circuit 200 includes a substrate 202 comprising a semiconductor material 204. The integrated circuit 200 further includes an interconnect region 206 disposed above the substrate 202. In the instant example, a first component 208 and a second component 234 are disposed in the substrate 202, possibly extending into the interconnect region 206, proximate to a boundary 210 between the substrate 202 and the interconnect region 206. In the instant example, the first component 208 and the second component 234 may be matching components whose performance benefits from having similar thermal environments. Matching components may be understood as components which are designed to have substantially equal performance parameters such as drive current and threshold. Because these performance parameters are affected by temperature, reducing a temperature difference between matching components may advantageously reduce differences in the performance parameters. The components 208 and 234 are depicted in FIG. 2A as MOS transistors, however other manifestations, such as bipolar junction transistors, JFETs, resistors, and SCRs are within the scope of the instant example. The components 208 and 234 may be laterally separated by field oxide 214 proximate to the boundary 210 between the substrate 202 and the interconnect region 206. The interconnect region 206 may include contacts 216, interconnects 218 and vias 220 disposed in a dielectric layer stack 222. The dielectric layer stack 222 includes a plurality of layers of dielectric material, such as a PMD layer 236 as shown in FIG. 2B, a plurality of IMD dielectric layers and a plurality of ILD layers. A top surface 224 of the interconnect region 206 is located at a surface of the interconnect region (206 opposite to the boundary 210 between the substrate 202 and the interconnect region 206.

A thermal via 230 is disposed in the interconnect region 206, extending over a portion, but not all, of the integrated circuit 200 in the interconnect region 206. In the instant example, the thermal via 230 laterally surrounds the components 208 and 234 in the PMD layer 236. The contacts 216 extend through the PMD layer 236. A first IMD layer 238 may be disposed over the thermal via 230 and the PMD layer 236, as shown in FIG. 2B. Other configurations of the thermal via 230 are within the scope of the instant example. Thus, the thermal via 230 may provide a more closely matched thermal environment for the first component 208 and the second component 234 and thereby improve their performance.

In the instant example, the thermal via 230 includes a cohered nanoparticle film 232 that includes primarily nanoparticles 233, and a layer of graphitic material 240 disposed on the cohered nanoparticle film 232, shown in detail in FIG. 2B. The nanoparticles 233 may include, for example, copper, nickel, palladium, platinum, iridium, rhodium, cerium, osmium, molybdenum and/or gold. Alternatively, the thermal via 230 may be substantially filled with nanoparticles, either electrically conducting or electrically non-conducting, for example as described in reference to FIG. 1A and FIG. 1B.

Figure 3:
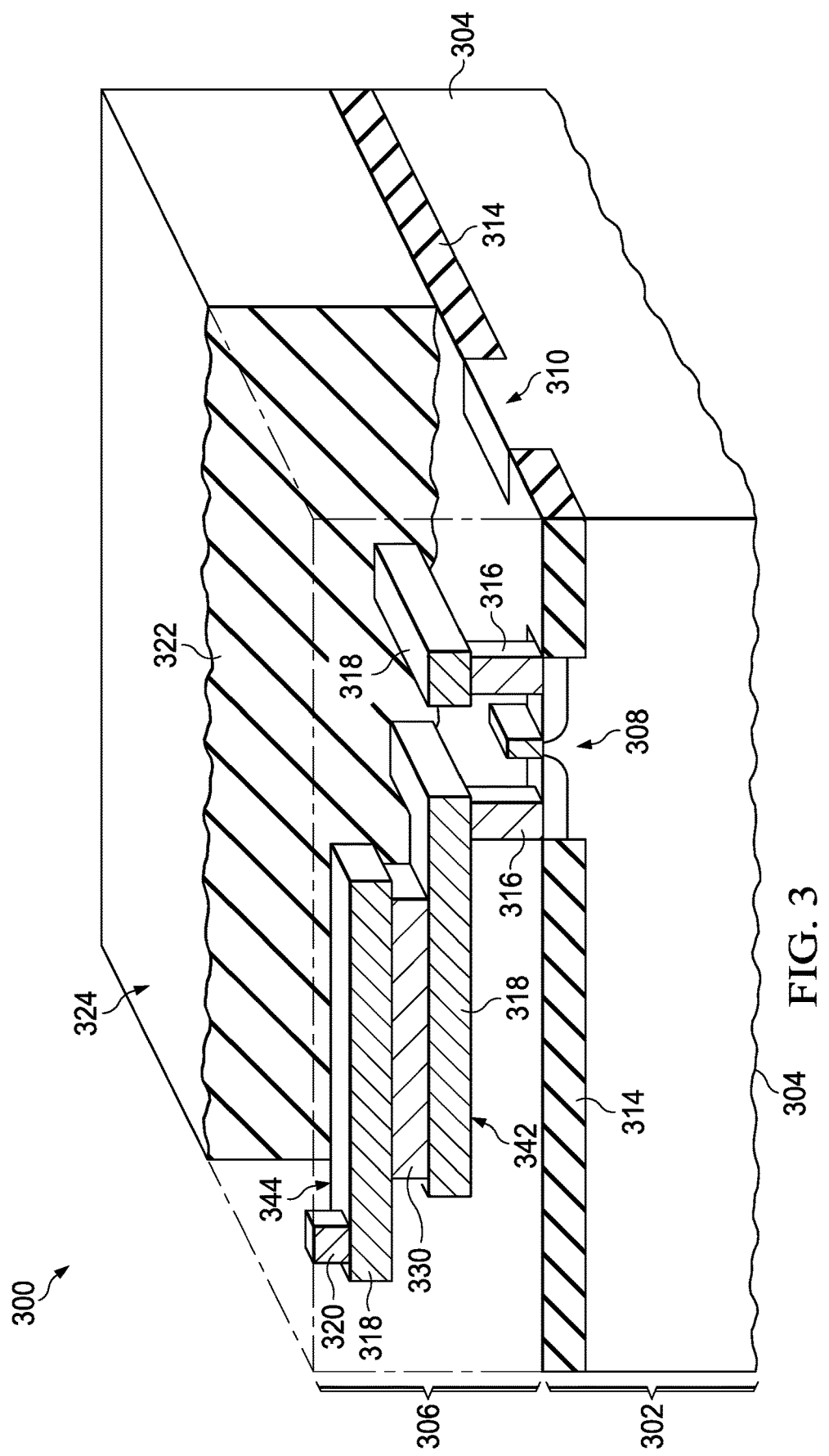
FIG. 3 is a cross section of another example integrated circuit containing a thermal via according to an embodiment of the invention.

FIG. 3 is a cross section of another example integrated circuit containing a thermal via according to an embodiment of the invention. Referring to FIG. 3, the integrated circuit 300 includes a substrate 302 comprising a semiconductor material 304. The integrated circuit 300 further includes an interconnect region 306 disposed above the substrate 302. In the instant example, a heat-generating component 308 is disposed in the substrate 302, proximate to a boundary 310 between the substrate 302 and the interconnect region 306. In the instant example, the component 308 may be thermally sensitive so that performance of the component 308 is improved by reducing a temperature of the component 308 during operation of the integrated circuit 300. The component 308 is depicted in FIG. 3 as a MOS transistor, however, other manifestations are within the scope of the instant example. The component 308 may be laterally isolated by field oxide 314 disposed proximate to the boundary 310 between the substrate 302 and the interconnect region 306. The interconnect region 306 may include contacts 316, interconnects 318 and vias 320 disposed in a dielectric layer stack 322. The dielectric layer stack 322 includes a plurality of layers of dielectric material. A top surface 324 of the interconnect region 306 is a surface of the interconnect region 306 located opposite to the boundary 310 between the substrate 302 and the interconnect region 306.

A thermal via 330 is disposed in the interconnect region 306, thermally coupling a first interconnect 342 of the interconnects 318 and a second interconnect 344 of the interconnects 318. The first interconnect 342 is directly electrically coupled to the heat-generating component 308. The second interconnect 344 may be thermally coupled to a heat removal structure, not shown, such as a heat sink. The second interconnect 344 may be in a different interconnect level from the first interconnect 342, as depicted in FIG. 3. Alternatively, the first interconnect 342 and the second interconnect 344 may be in a same interconnect level. The thermal via 330 includes a cohered nanoparticle film in which adjacent nanoparticles cohere to each other, for example as described in reference to FIG. 1A and FIG. 1B. The thermal via 330 may also include graphitic material, as described in reference to FIG. 2A and FIG. 2B. In one version of the instant example, the thermal via 330 may include nanoparticles of electrically non-conductive material, configured so that the first interconnect 342 is electrically isolated from the second interconnect 344. In another version of the instant example, in which the thermal via 330 may include electrically conducting nanoparticles or graphitic material, one or more layers of dielectric material may isolate the thermal via 330 so that the first interconnect 342 is electrically isolated from the second interconnect 344. Thus, the thermal via 330 may provide a structure for removing heat from the heat-generating component 308 without degrading electrical performance of the heat-generating component 308.

Figure 4:
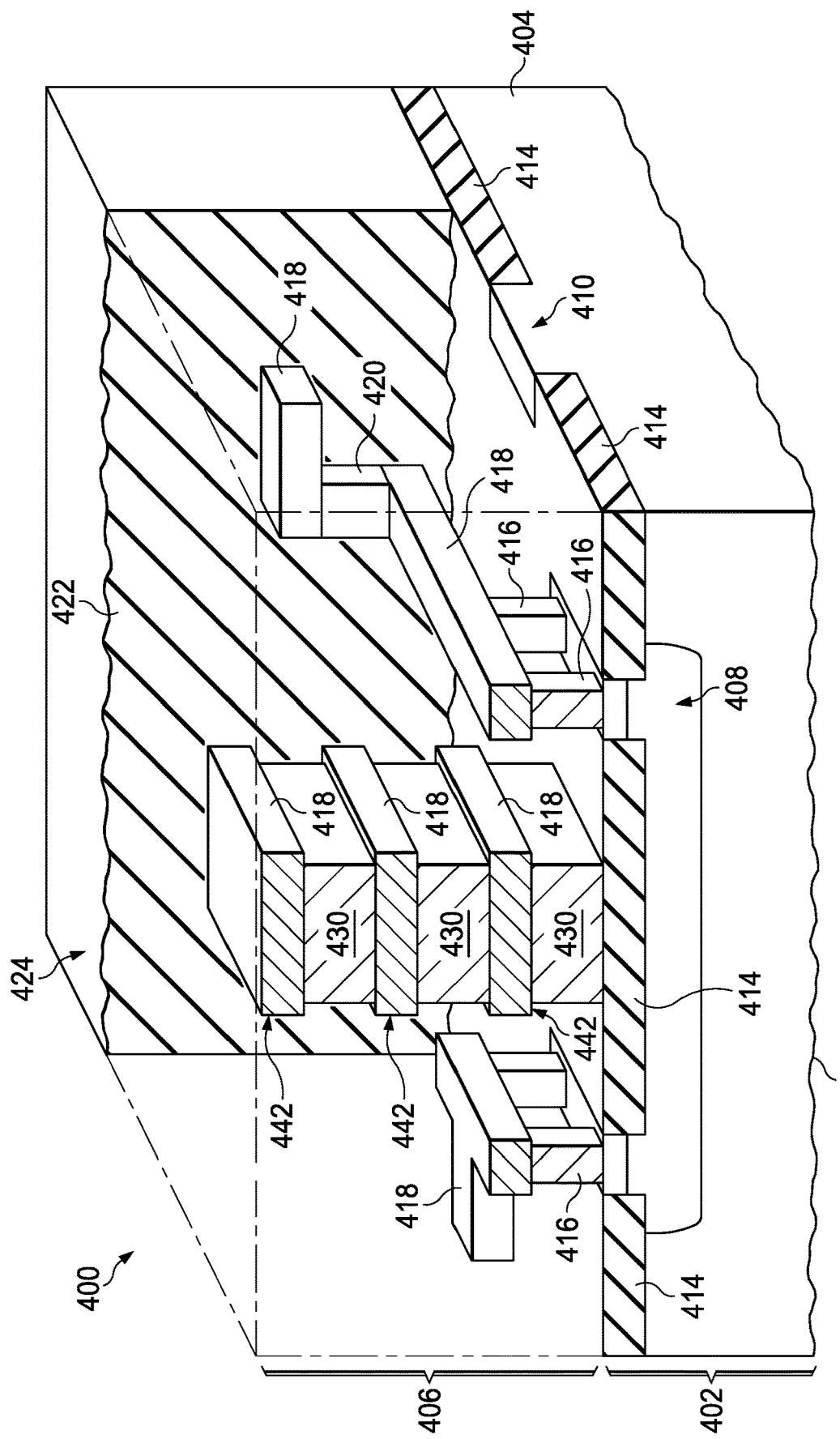
FIG. 4 is a cross section of another example integrated circuit containing a thermal via according to an embodiment of the invention.

FIG. 4 is a cross section of another example integrated circuit containing a thermal via according to an embodiment of the invention. Referring to FIG. 4, the integrated circuit 400 includes a substrate 402 comprising a semiconductor material 404, and an interconnect region 406 disposed above the substrate 402. In the instant example, a heat-generating component 408 is disposed in the substrate 402, proximate to a boundary 410 between the substrate 402 and the interconnect region 406. In the instant example, the component 408 may be thermally sensitive so that performance of the component 408 is improved by reducing a temperature of the component 408 during operation of the integrated circuit 400. The component 408 is depicted in FIG. 4 as a well resistor, however other manifestations are within the scope of the instant example. The component 408 may be laterally isolated by field oxide 414 disposed proximate to the boundary 410 between the substrate 402 and the interconnect region 406. The interconnect region 406 may include a plurality of contacts 416, a plurality of interconnects 418 and a plurality of vias 420 disposed in a dielectric layer stack 422. The dielectric layer stack 422 includes a plurality of layers of dielectric material. A top surface 424 of the interconnect region 406 is located opposite from the boundary 410 between the substrate 402 and the interconnect region 406.

A plurality of thermal vias 430 are disposed in the interconnect region 406 in a vertical configuration, alternating with non-circuit interconnects 442 of the plurality of interconnects 418. In the instant example, the non-circuit interconnects 442 are not included in electrical circuits of the integrated circuit 400, that is, the non-circuit interconnects 442 are not directly electrically coupled to active components of the integrated circuit 400 and do not conduct electrical current during operation of the integrated circuit 400. The thermal vias 430 include a cohered nanoparticle film which includes primarily nanoparticles, in which adjacent nanoparticles cohere to each other. The thermal vias 430 may also include graphitic material. The thermal vias 430 may have structures as described in any of the examples disclosed herein. The stack of alternating thermal vias 430 and non-circuit interconnects 442 may extend from the boundary 410 between the substrate 402 and the interconnect region 406 to the top surface 424 of the interconnect region 406, as indicated in FIG. 4. Thus, the thermal vias 430 may provide a structure for removing heat from the heat-generating component 408 to a heat removal structure, such as a heat sink, not shown, disposed over the top surface 424 of the interconnect region 406.

Figure 5A:
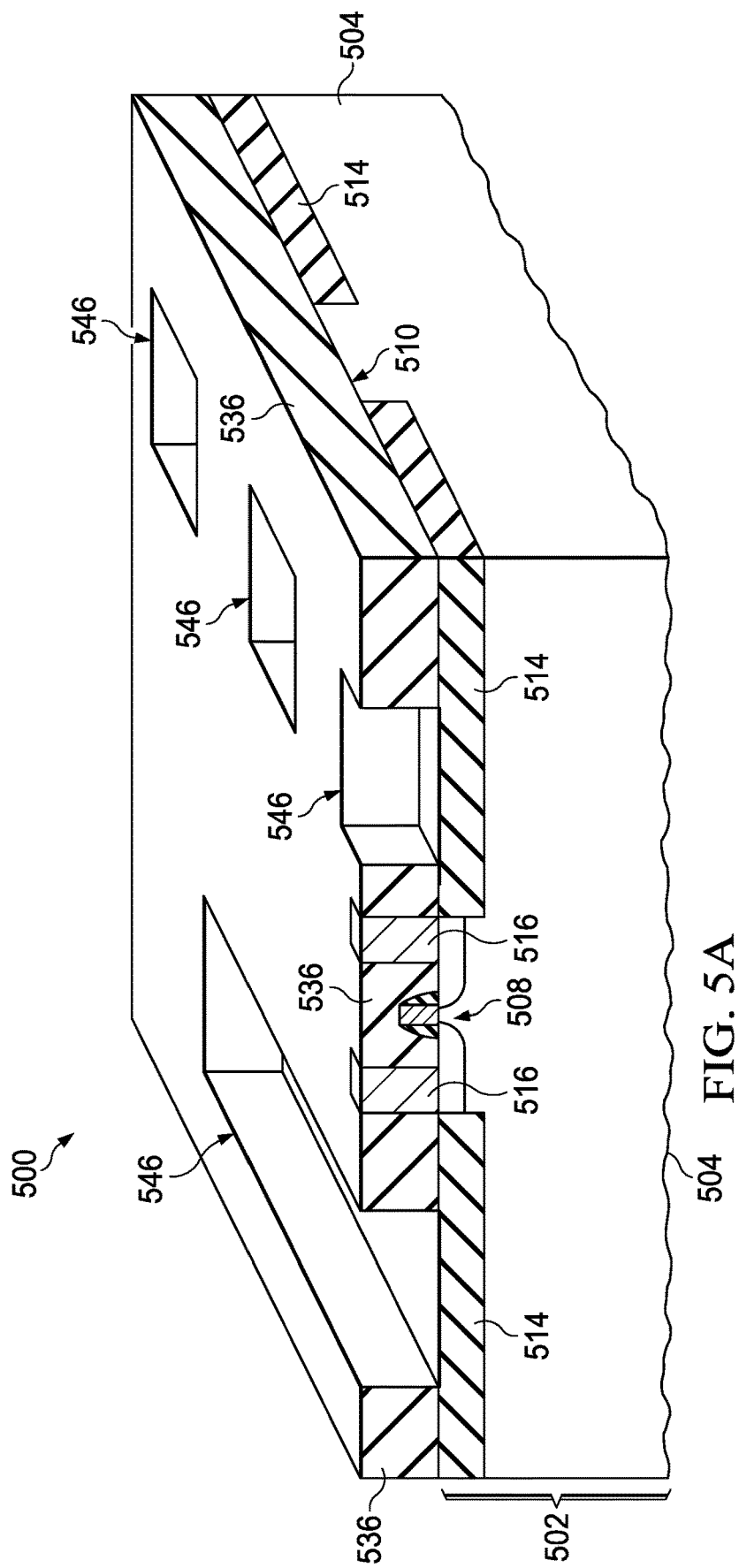

FIG. 5A through FIG. 5G depict an example method of forming an integrated circuit with thermal vias according to an embodiment of the invention. Referring to FIG. 5A, the integrated circuit 500 is formed on a substrate 502 which includes a semiconductor material 504. In the instant example, a component 508 is formed in the semiconductor material 504. The component 508 may be a MOS transistor as depicted in FIG. 5A, or may be another type of component, such as a bipolar junction transistor, a JFET, a resistor, an SCR, or a diode. Field oxide 514 may be formed proximate to a top surface 510 of the substrate 502 to laterally isolate the component 508. The field oxide 514 may be formed by an STI process or alternatively by a LOCOS process.

A PMD layer 536 is formed over the top surface 510 of the substrate 502. The PMD layer 536 is part of a dielectric layer stack of an interconnect region of the integrated circuit 500. FIG. 5A shows the integrated circuit 500 at a point in which the interconnect region is partway through completion. The PMD layer 536 may be formed directly over the substrate 502. Contacts 516 may be subsequently formed through the PMD layer 536 to make electrical connections to the component 508.

Forming the thermal vias of the instant example begins with forming trenches 546 through the PMD layer 536 in areas for the thermal vias. The trenches 546 may be located over the field oxide 514 as depicted in FIG. 5A. The trenches 546 may be formed, for example, by forming a mask over the PMD layer 536, wherein the mask exposes area for the thermal vias. Subsequently, an etch process such as a reactive ion etch (RIE) process, is performed which removes material from the PMD layer 536 in the areas exposed by the mask, to form the trenches 546. The mask may be removed after the etch process is completed. Other methods of forming the trenches, such as laser ablation, are within the scope of the instant example. The trenches 546 may extend all the way through the PMD layer 536 as depicted in FIG. 5A, or may extend partway through.

Figure 5B:
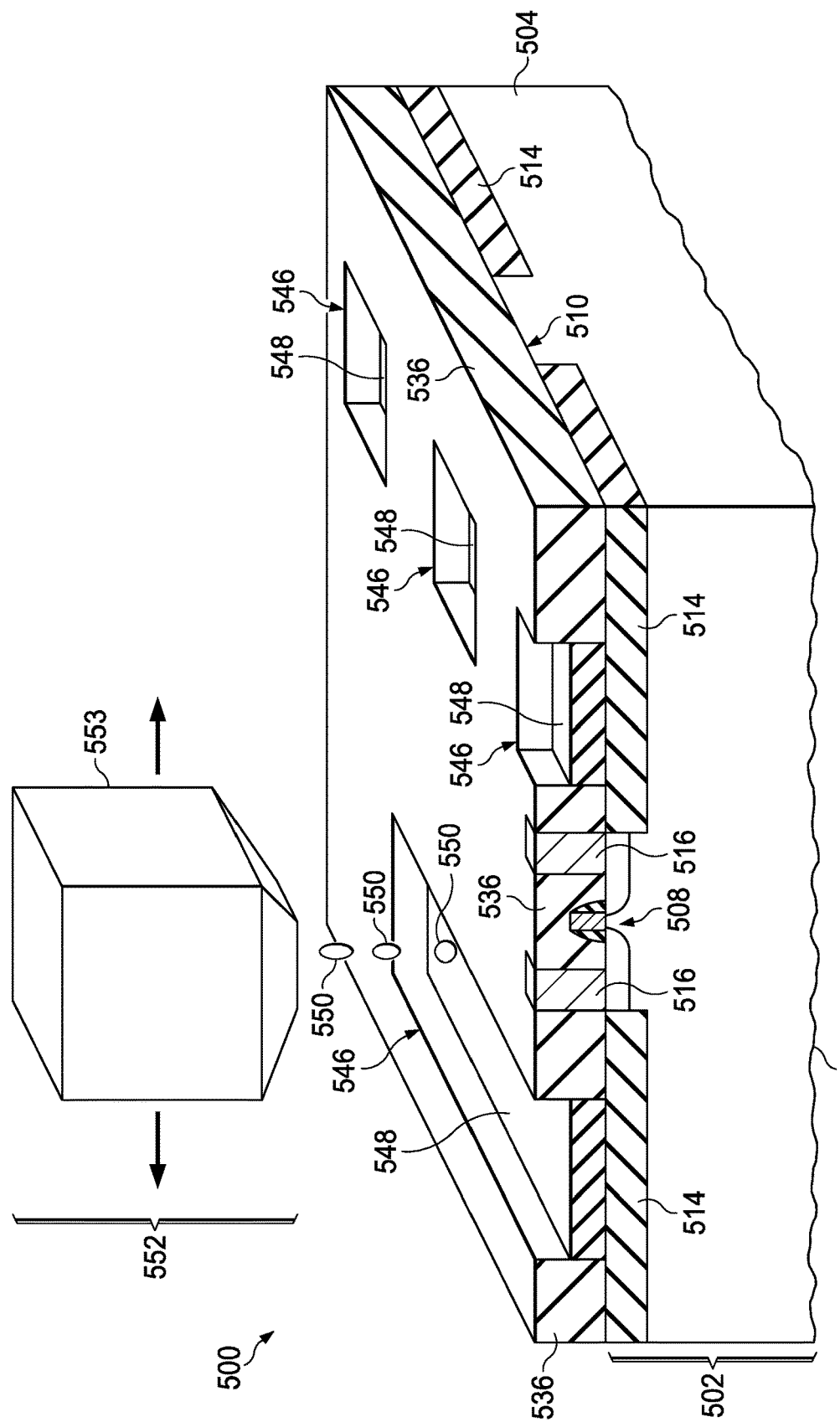

Referring to FIG. 5B, a first nanoparticle ink film 548 is formed by dispensing a first nanoparticle ink 550 by a first additive process 552 into the trenches 546. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. The first nanoparticle ink 550 includes the nanoparticles and a carrier fluid. The first nanoparticle ink 550 may be, for example, an ink, a slurry, or a sol gel. The nanoparticles may include materials described for the nanoparticles 133 in reference to FIG. 1A and FIG. 1B. There may be inorganic functional molecules, for example molecules including silicon and oxygen, on surfaces of the nanoparticles. The first nanoparticle ink 550 is dispensed into the trenches 546, and is not dispensed over the entire instant top surface of the integrated circuit 500. The first additive process 552 may use a discrete droplet dispensing apparatus 553, as indicated in FIG. 5B, such as an ink jet apparatus. The integrated circuit 500 and the discrete droplet dispensing apparatus 553 may be configured to move laterally with respect to each other to provide a desired dispensing pattern for the first nanoparticle ink film 548. The discrete droplet dispensing apparatus 553 may have a plurality of dispensing ports which may be independently activated in parallel to provide a desired throughput for the first additive process 552. Other manifestations of the first additive process 552, such as a continuous extrusion process, a direct laser transfer process, an electrostatic deposition process, or an electrochemical deposition process are within the scope of the instant example. The first nanoparticle ink film 548 fills the trenches 546 partway, but not completely.

Referring to FIG. 5C, the first nanoparticle ink film 548 of FIG. 5B is heated by a first bake process 554 to remove at least a portion of a volatile material from the first nanoparticle ink film 548 to form a first nanoparticle film 556 which includes primarily nanoparticles. The first bake process 554 may be a radiant heat process, using, for example, an incandescent light source 555, as indicated schematically in FIG. 5C, or infrared light emitting diodes (IR LEDs). Alternatively, the first bake process 554 may be a hot plate process which heats the first nanoparticle ink film 548 through the substrate 502. The first bake process 554 may be performed in a partial vacuum, or in an ambient with a continuous flow of gas at low pressure, to enhance removal of the volatile material.

Figure 5D:
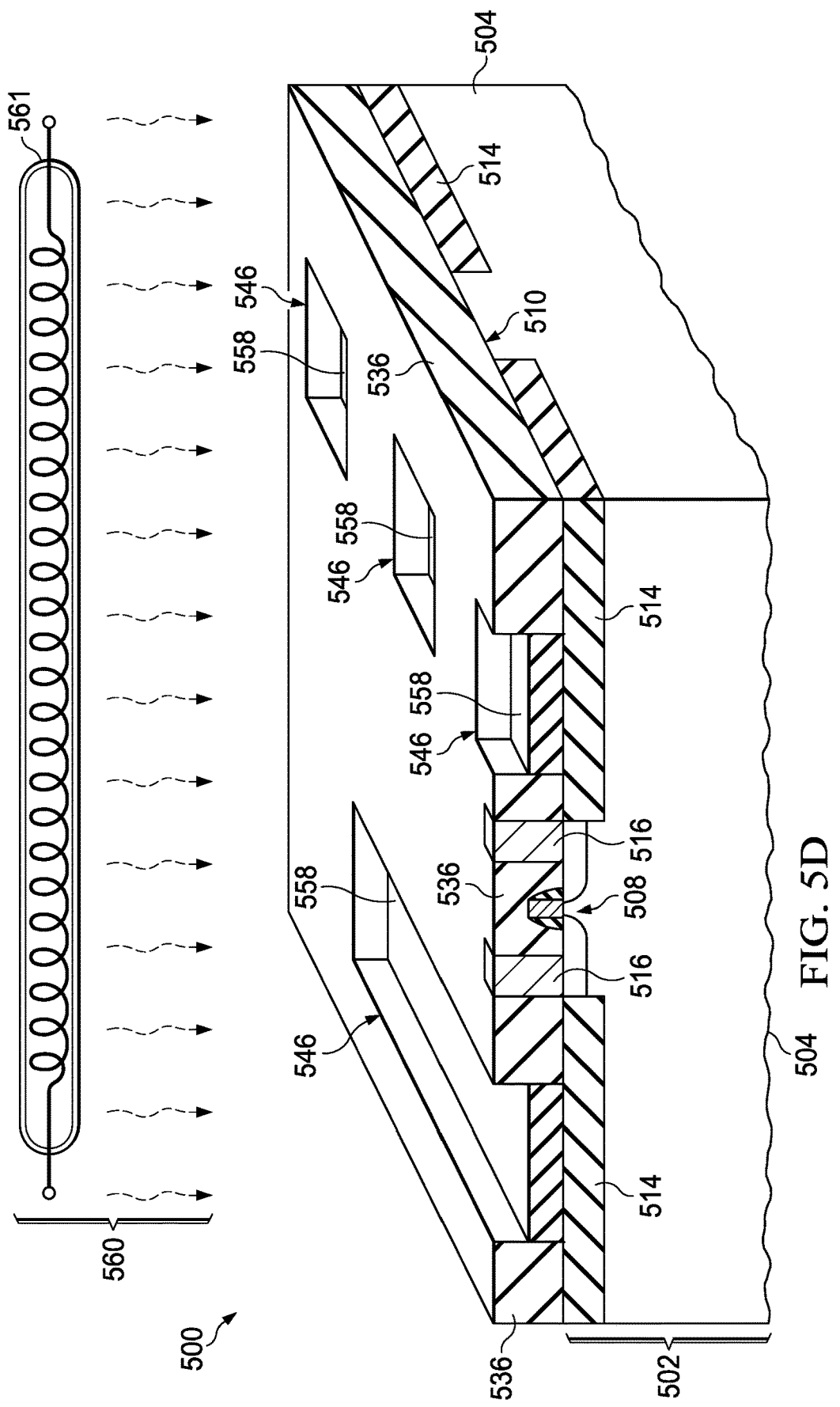

Referring to FIG. 5D, the first nanoparticle film 556 of FIG. 5C is heated by a first cohesion inducing process 560 so that adjacent nanoparticles cohere to each other, to form a first cohered nanoparticle film 558. The temperature required for the nanoparticles to cohere to each other is a function of the size of the nanoparticles. Smaller nanoparticles may be heated at lower temperatures than larger nanoparticles to attain a desired cohesion of the nanoparticles. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms between the adjacent nanoparticles. The first cohesion inducing process 560 may include a spike heating process using an incandescent light source 561 as depicted schematically in FIG. 5D. The spike heating process 560 may apply radiant energy for 100 milliseconds to 5 seconds.

In one variation of the instant example, the first cohesion inducing process 560 may include a flash heating process, which applies radiant energy for 1 microsecond to 10 microseconds. In another variation, the first cohesion inducing process 560 may include a scanned laser heating process, which applies radiant energy selectively to the first nanoparticle film 556. In an alternate version of the instant example, the first bake process 554 described in reference to FIG. 5C may be combined with the first cohesion inducing process 560, wherein thermal power applied to the first nanoparticle film 556 is ramped to first remove the volatile material, followed by inducing cohesion of the nanoparticles. Other methods of inducing cohesion between the nanoparticles are within the scope of the instant example.

Figure 5E:
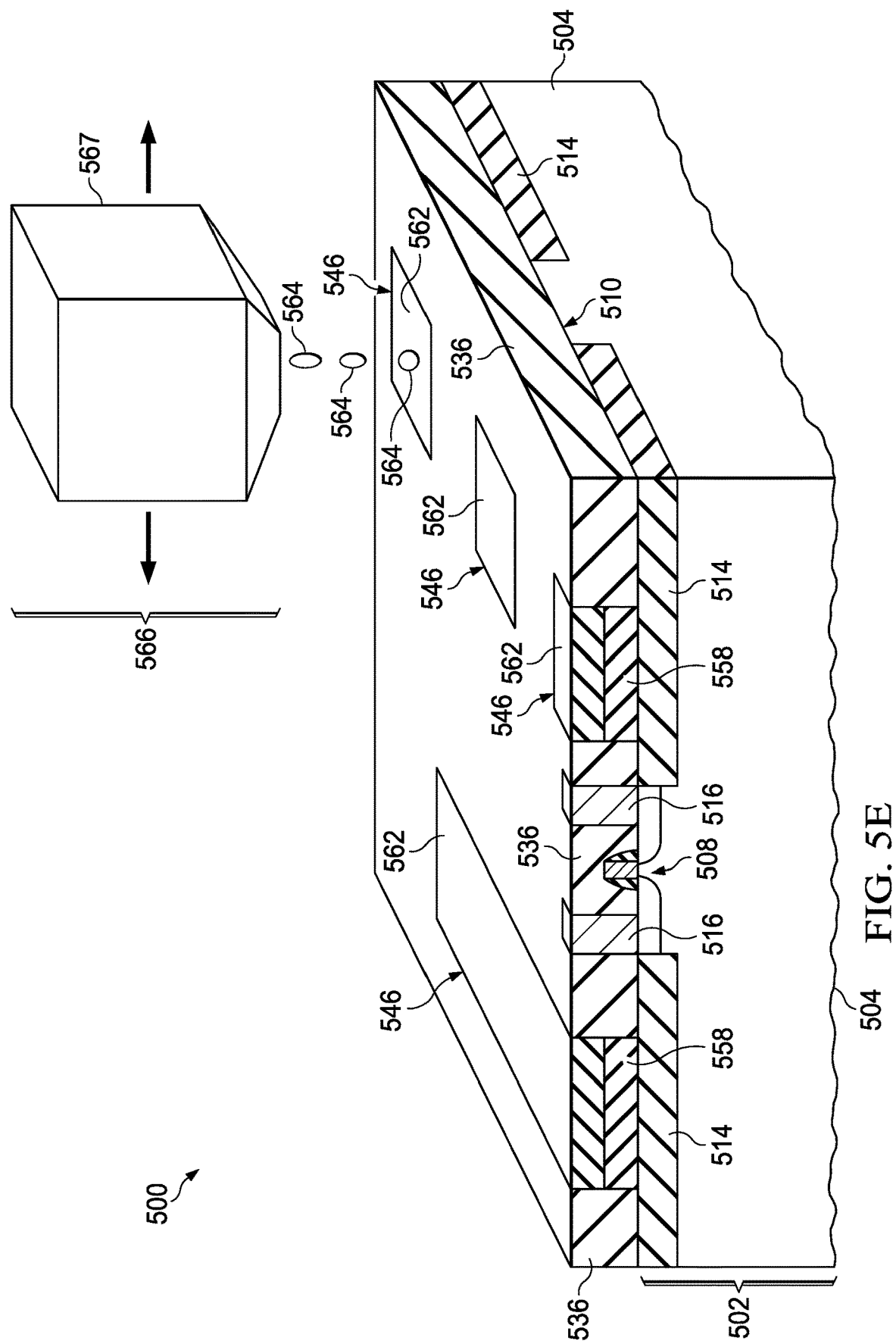

Referring to FIG. 5E, a second nanoparticle ink film 562 is formed by dispensing a second nanoparticle ink 564 by a second additive process 566 into the trenches 546 on the first cohered nanoparticle film 558. The second additive process 566 may use a similar apparatus as the first additive process 552 of FIG. 5B, such as an ink jet apparatus 567 as indicated in FIG. 5E. Similarly, the second nanoparticle ink 564 may have a same composition as the first nanoparticle ink 550 of FIG. 5B. The second nanoparticle ink film 562 extends to tops of the trenches 546. The second additive process 566 dispenses the second nanoparticle ink 564 into the trenches 546, and not over a top surface of the PMD layer 536.

Figure 5F:
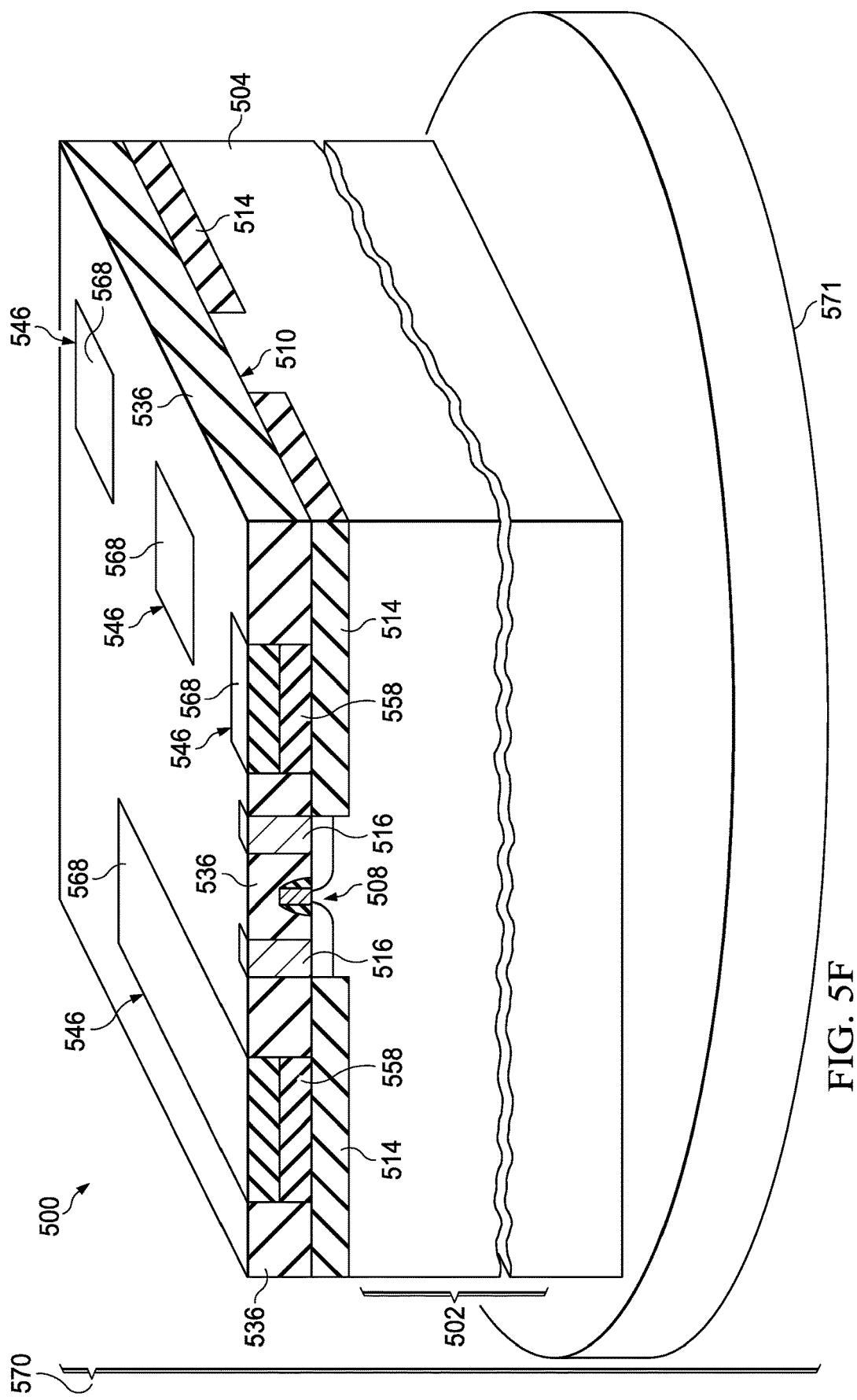

Referring to FIG. 5F, the second nanoparticle ink film 562 of FIG. 5E is heated by a second bake process 570 to remove at least a portion of a volatile material from the second nanoparticle ink film 562 to form a second nanoparticle film 568 which includes primarily nanoparticles. The second bake process 570 may be a hot plate process using a hot plate 571, as indicated schematically in FIG. 5F. Alternatively, the second bake process may be radiant heat process. The second bake process 570 may be performed in a partial vacuum, or in an ambient with a continuous flow of gas at low pressure, to enhance removal of the volatile material.

Figure 5G:
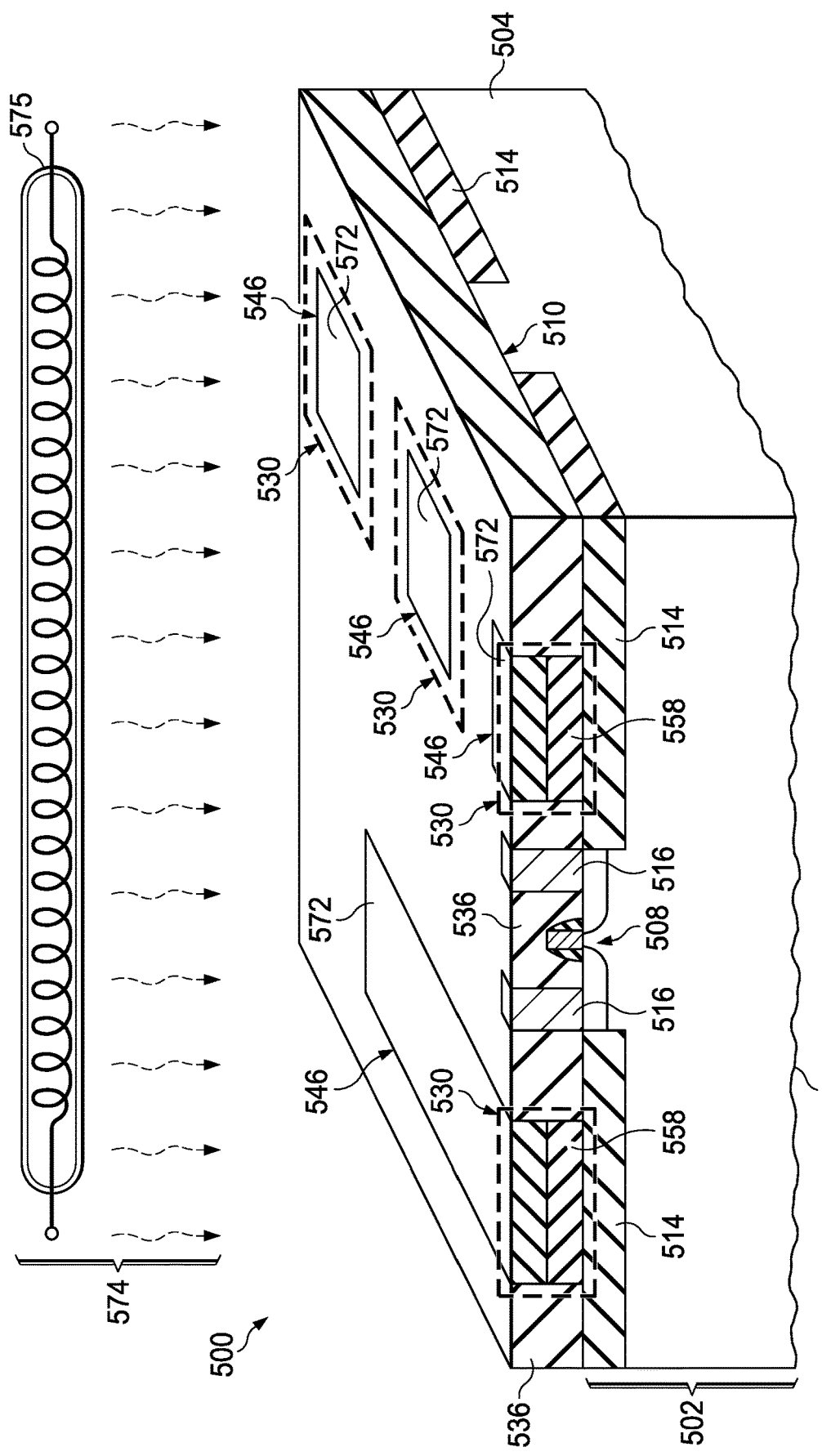

Referring to FIG. 5G, the second nanoparticle film 568 of FIG. 5F is heated by a second cohesion inducing process 574 so that adjacent nanoparticles in the second nanoparticle film 568 cohere to each other, to form a second cohered nanoparticle film 572 in the trenches 546 over the first cohered nanoparticle film 558. The second cohesion inducing process 574 may include, for example, a spike heating process using an incandescent light source 575 as depicted in FIG. 5G. Further cohesion of the nanoparticles in the first cohered nanoparticle film 558 may be induced by the second cohesion inducing process 574. The first cohered nanoparticle film 558 and the second cohered nanoparticle film 572 may provide the thermal vias 530. The thermal vias 530 may be spatially configured, for example, according to any of the examples disclosed herein. Additional thermal vias may be formed in subsequent dielectric layers of the dielectric layer stack of the interconnect region of the integrated circuit 500.

Figure 6A:
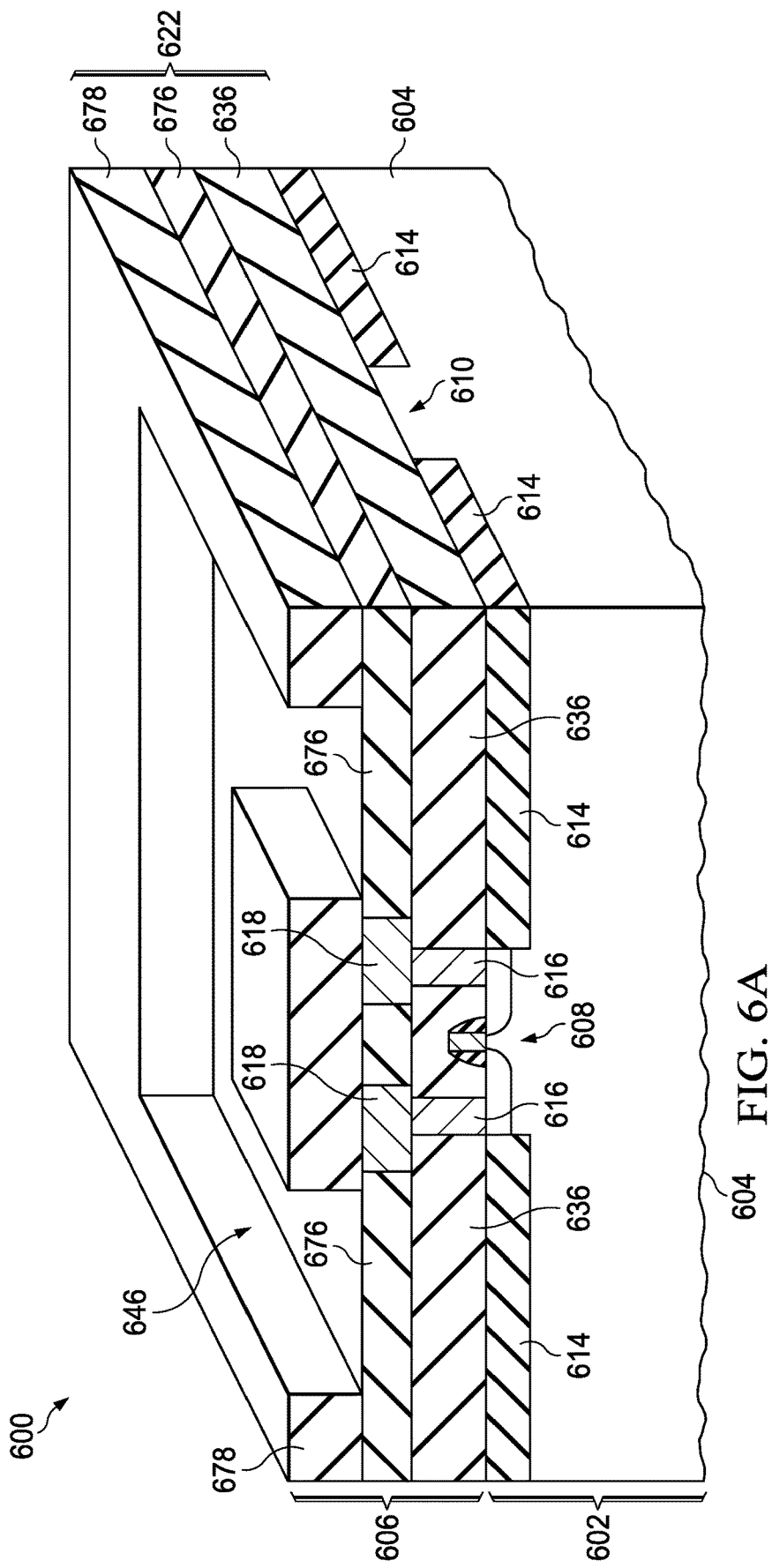
FIG. 6A through FIG. 6E depict another example method of forming an integrated circuit with a thermal via according to an embodiment of the invention.

FIG. 6A through FIG. 6E depict another example method of forming an integrated circuit with a thermal via according to an embodiment of the invention. Referring to FIG. 6A, the integrated circuit 600 is formed on a substrate 602 which includes a semiconductor material 604. A component 608, depicted in FIG. 6A as a MOS transistor, is formed in the semiconductor material 604. Field oxide 614 may be formed proximate to a top surface 610 of the substrate 602 to laterally isolate the component 608. An interconnect region 606 is formed over the top surface 610 of the substrate 602. The interconnect region 606 includes a dielectric layer stack 622 comprising a plurality of layers of dielectric material. FIG. 6A through FIG. 6E depict the interconnect region 606 partly completed. A PMD layer 636 of the dielectric layer stack 622 is formed directly over the top surface 610 of the substrate 602 and over the component 608. Contacts 616 are formed through the PMD layer 636, making electrical connections to the component 608. An IMD layer 676 is formed over the PMD layer 636, and interconnects 618 are disposed in the IMD layer 676. The interconnects 618 make electrical connections to the contacts 616. An ILD layer 678 is formed over the IMD layer 676. Vias will be subsequently formed through the ILD layer 678 to make electrical connections to the interconnects 618.

Formation of the thermal via begins with forming a trench 646 in the ILD layer 678. The trench 646 may extend to a boundary between the IMD layer 676 and the ILD layer 678 as depicted in FIG. 6A, may extend into the IMD layer 676, or may stop short of the IMD layer 676, leaving a portion of the ILD layer 678 under the trench 646. The trench 646 may be formed by a mask and etch process, as described in reference to FIG. 5A, or by another method.

Figure 6B:
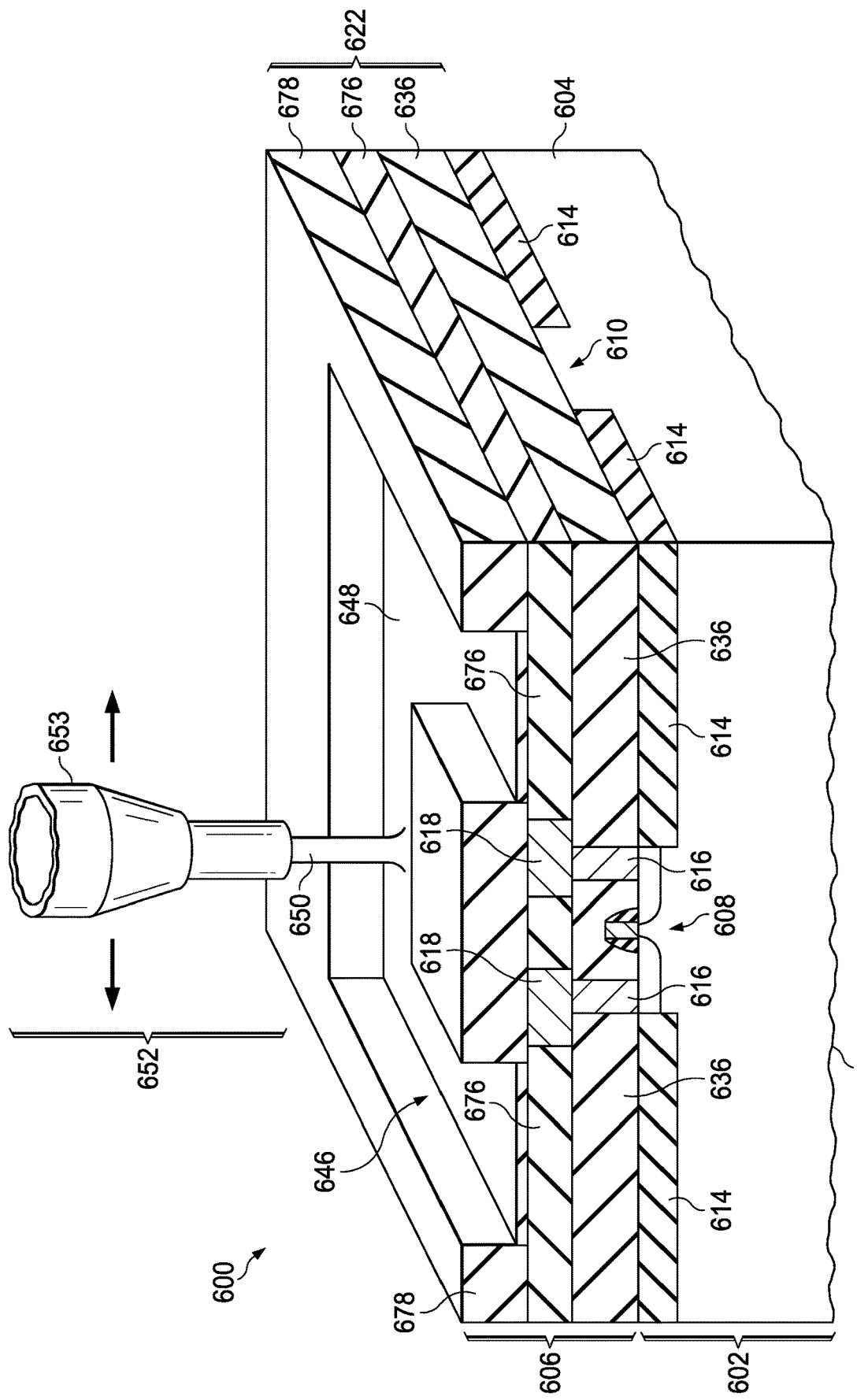

Referring to FIG. 6B, a nanoparticle ink film 648 is formed by dispensing a nanoparticle ink 650 by an additive process 652 into the trench 646. The additive process 652 may use a continuous extrusion apparatus 653, as indicated in FIG. 6B. Other manifestations of the additive process 652 are within the scope of the instant example. The nanoparticle ink film 648 is formed at a bottom of the trench 646. The nanoparticle ink 650 includes the nanoparticles and a carrier fluid. The nanoparticles of the instant example include metals suitable for catalyzing formation of graphite, such as copper, nickel, palladium, platinum, iridium, rhodium, cerium, osmium, molybdenum and/or gold. The nanoparticle ink 650 is dispensed into the trench 646, and is not dispensed over a top surface of the ILD layer 678. The dispensing apparatus 653 for the additive process 652 may be configured so that the integrated circuit 600 and the dispensing apparatus 653 may be moved laterally with respect to each other to provide a desired dispensing pattern for the nanoparticle ink film 648.

Figure 6C:
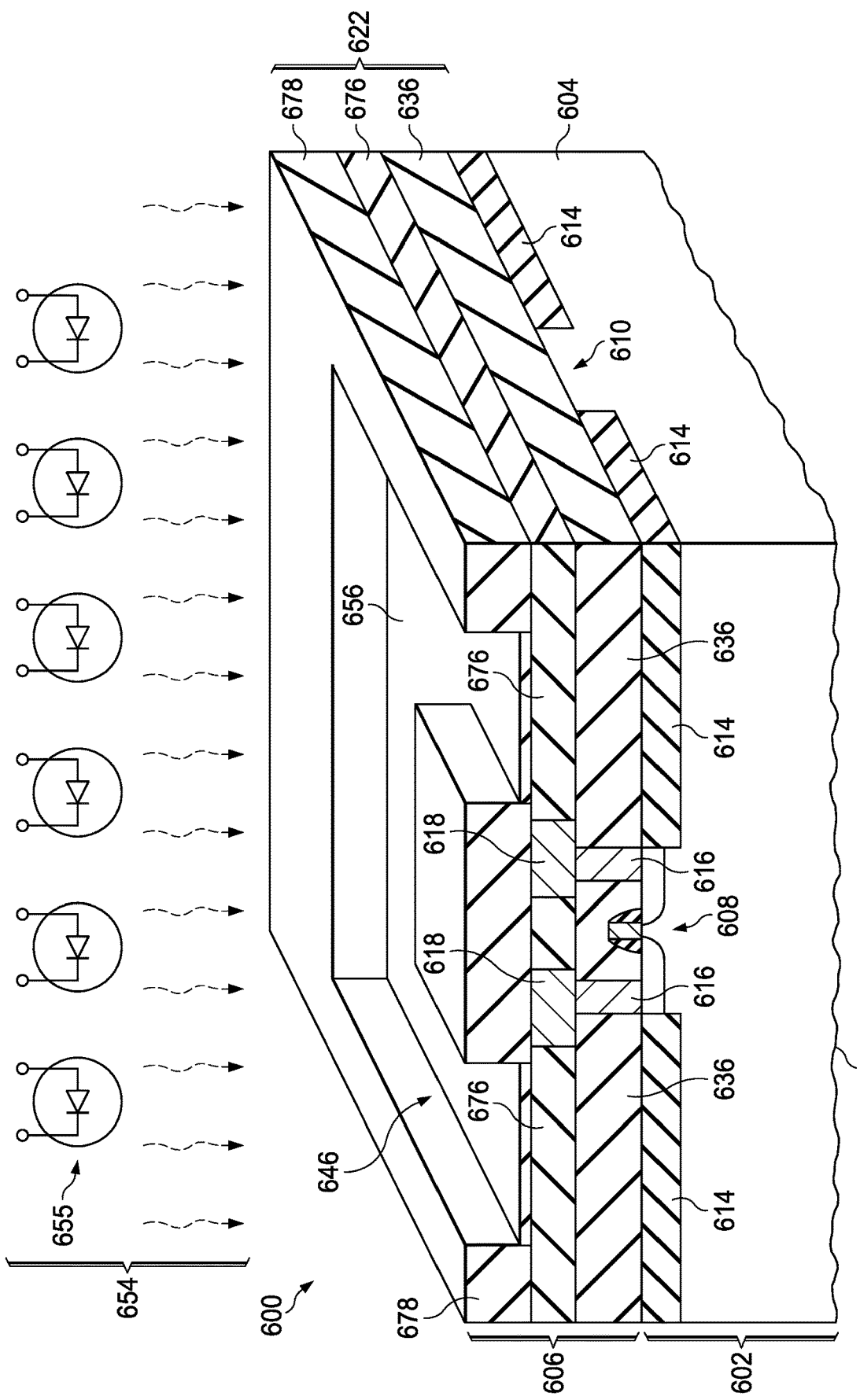

Referring to FIG. 6C, the nanoparticle ink film 648 of FIG. 6B is heated by a bake process 654 to remove at least a portion of a volatile material from the nanoparticle ink film 648 to form a nanoparticle film 656 which includes primarily nanoparticles. The bake process 654 may be a radiant heat process using IR LEDs 655, as indicated schematically in FIG. 6C. The bake process 654 may be performed in a partial vacuum, or in an ambient with a continuous flow of gas at low pressure.

Figure 6D:
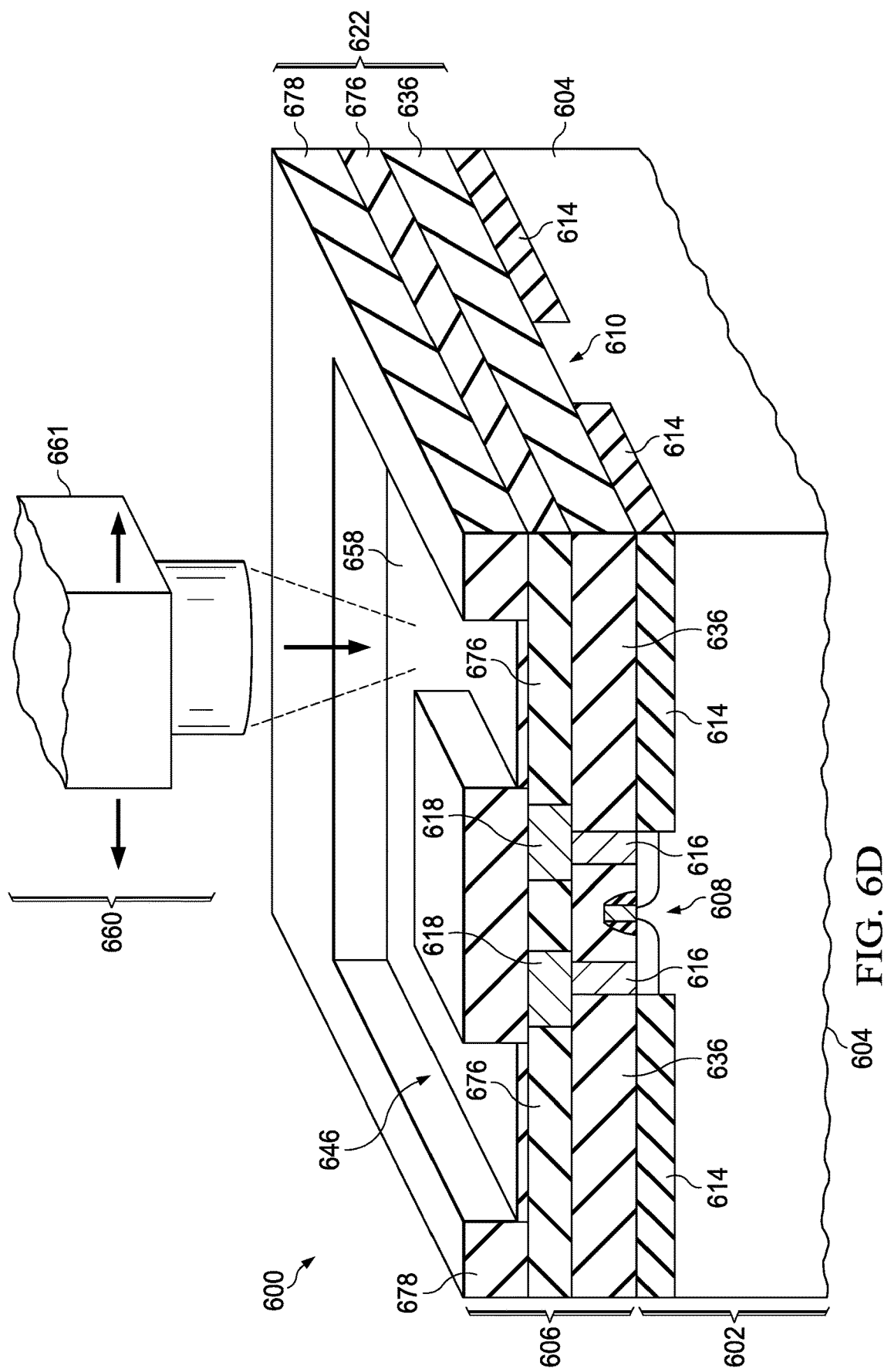

Referring to FIG. 6D, the nanoparticle film 656 of FIG. 6C is heated by a cohesion inducing process 660 so that adjacent nanoparticles cohere to each other, to form a cohered nanoparticle film 658 in the trench 646. The cohesion inducing process 660 may include a scanning laser heating process, using a scanning laser apparatus 661 as depicted in FIG. 6D. The scanning laser apparatus 661 may be configured to heat the nanoparticle film 656 without significantly heating areas of the integrated circuit 600 outside of the trench 646. Other methods for inducing cohesion between adjacent nanoparticles in the cohered nanoparticle film 658 are within the scope of the instant example. In the instant example, the cohered nanoparticle film 658 fills a lower portion of the trench, leaving space in the trench 646 for subsequently formed graphitic material.

Figure 6E:
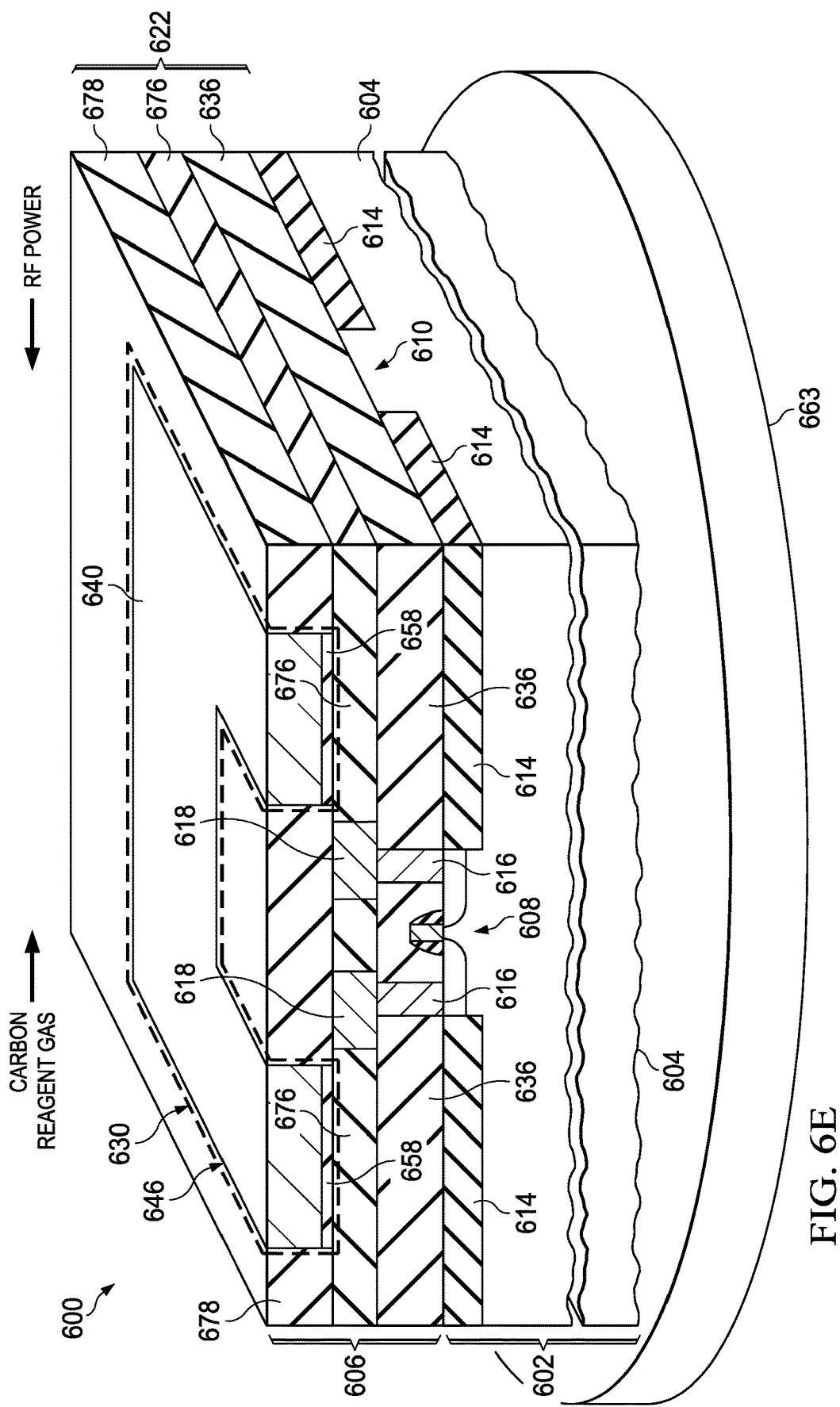

Referring to FIG. 6E, a layer of graphitic material 640 is selectively formed in the trench 646 on the cohered nanoparticle film 658 by a graphitic material PECVD process. In the graphitic material PECVD process, the substrate 602 is heated, for example by a hot plate 663, to a temperature of 200° C. to 400° C. A carbon-containing reagent gas, denoted in FIG. 6E as "CARBON REAGENT GAS" is flowed over the integrated circuit 600 and radio frequency (RF) power, denoted in FIG. 6E as "RF POWER" is applied to the carbon-containing reagent gas to generate carbon radicals above the integrated circuit 600. The carbon-containing reagent gas may include methane, straight chain alkanes such as ethane, propane and/or butane, alcohols such as ethanol, and/or cyclic hydrocarbons such as cyclobutane or benzene. Additional gases, such as hydrogen, argon and/or oxygen, may be flowed over the integrated circuit

600. The metal in the nanoparticles in the cohered nanoparticle film 658 catalyze the carbon radicals to react to form the graphitic material 640, so that a first layer of the layer of graphitic material 640 is formed selectively on the cohered nanoparticle film 658. Subsequent layers of the graphitic material 640 are formed selectively on the previously formed layers of graphitic material 640, so that the layer of graphitic material 640 is formed selectively on the cohered nanoparticle film 658, and the graphitic material 640 is not formed on the integrated circuit 600 outside of the cohered nanoparticle film 658. The cohered nanoparticle film 658 and the layer of graphitic material 640 provide the thermal via 630. Formation of the integrated circuit 600 continues with formation of additional IMD layers and ILD layers, and interconnects and vias. Additional thermal vias may be formed in the additional ILD layers, for example as described in reference to FIG. 6A through FIG. 6E.

Figure 7A:
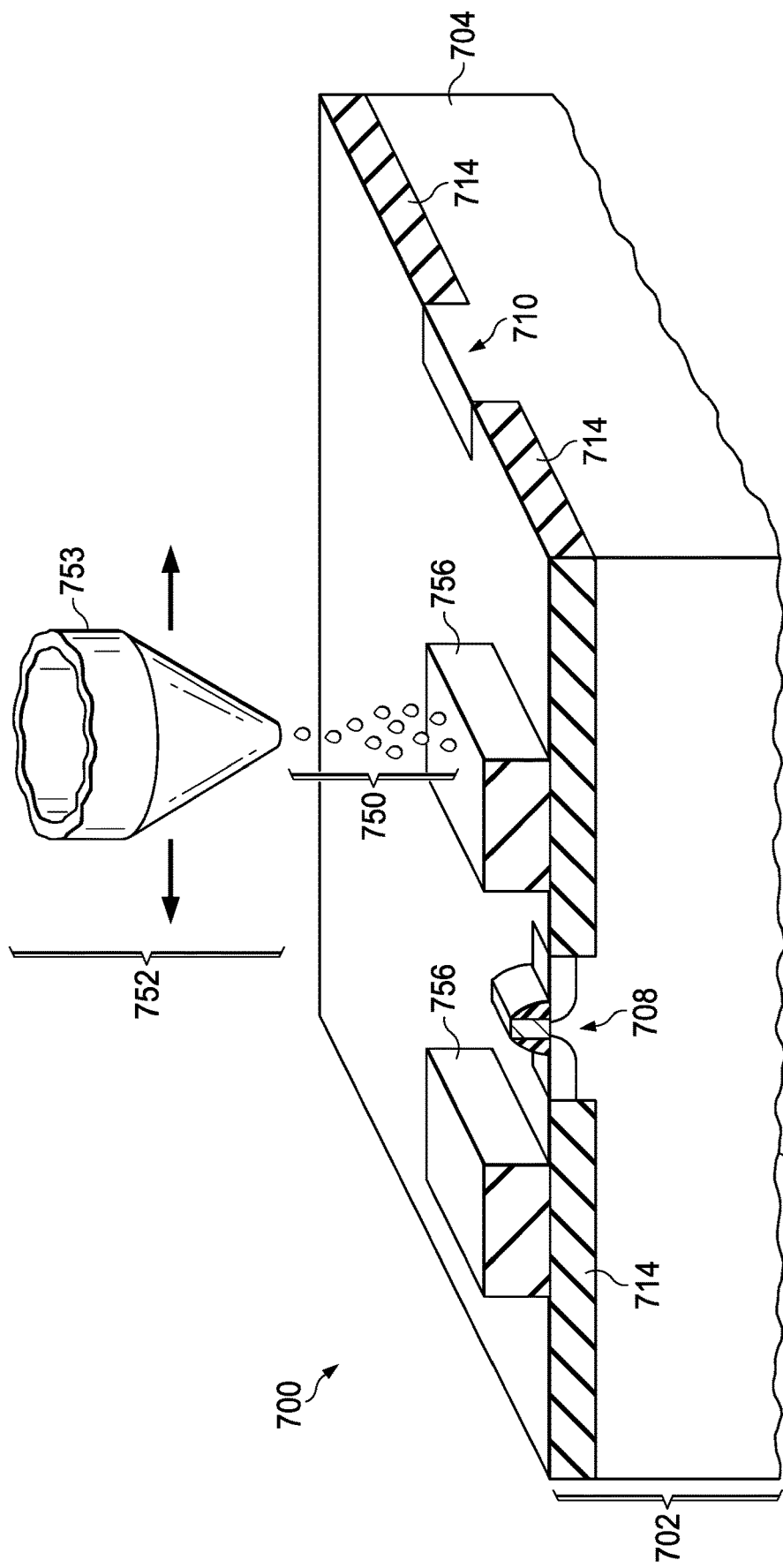
FIG. 7A through FIG. 7D depict a further example method of forming an integrated circuit with thermal vias according to an embodiment of the invention.

FIG. 7A through FIG. 7D depict a further example method of forming an integrated circuit with thermal vias according to an embodiment of the invention. Referring to FIG. 7A, the integrated circuit 700 is formed on a substrate 702 which includes a semiconductor material 704. A component 708, depicted in FIG. 7A as a MOS transistor, is formed in the semiconductor material 704. Field oxide 714 may be formed proximate to a top surface 710 of the substrate 702 to laterally isolate the component 708. Formation of the thermal vias begins in the instant example with dispensing a nanoparticle ink 750 onto an instant top surface of the integrated circuit 700, for example onto a top surface of the field oxide 714 as depicted in FIG. 7A, to form nanoparticle ink films 756 in areas for the thermal vias. The nanoparticle ink 750 may include nanoparticles and a carrier fluid. The nanoparticles may have inorganic functional molecules on surfaces of the nanoparticles to promote cohesion to adjacent nanoparticles and to the instant top surface of the integrated circuit 700. The nanoparticle ink 750 may be dispensed by an electrostatic deposition process 752 using an electrostatic nozzle 753 as depicted schematically in FIG. 7A. Other methods for dispensing the nanoparticle ink 750 are within the scope of the instant example. The nanoparticle ink films 756 are substantially free of organic binder material such as adhesive or polymer. A thickness of the nanoparticle ink films 756 may be at least as much as a desired thickness for a subsequently formed dielectric layer which will laterally surround the thermal vias.

Figure 7B:
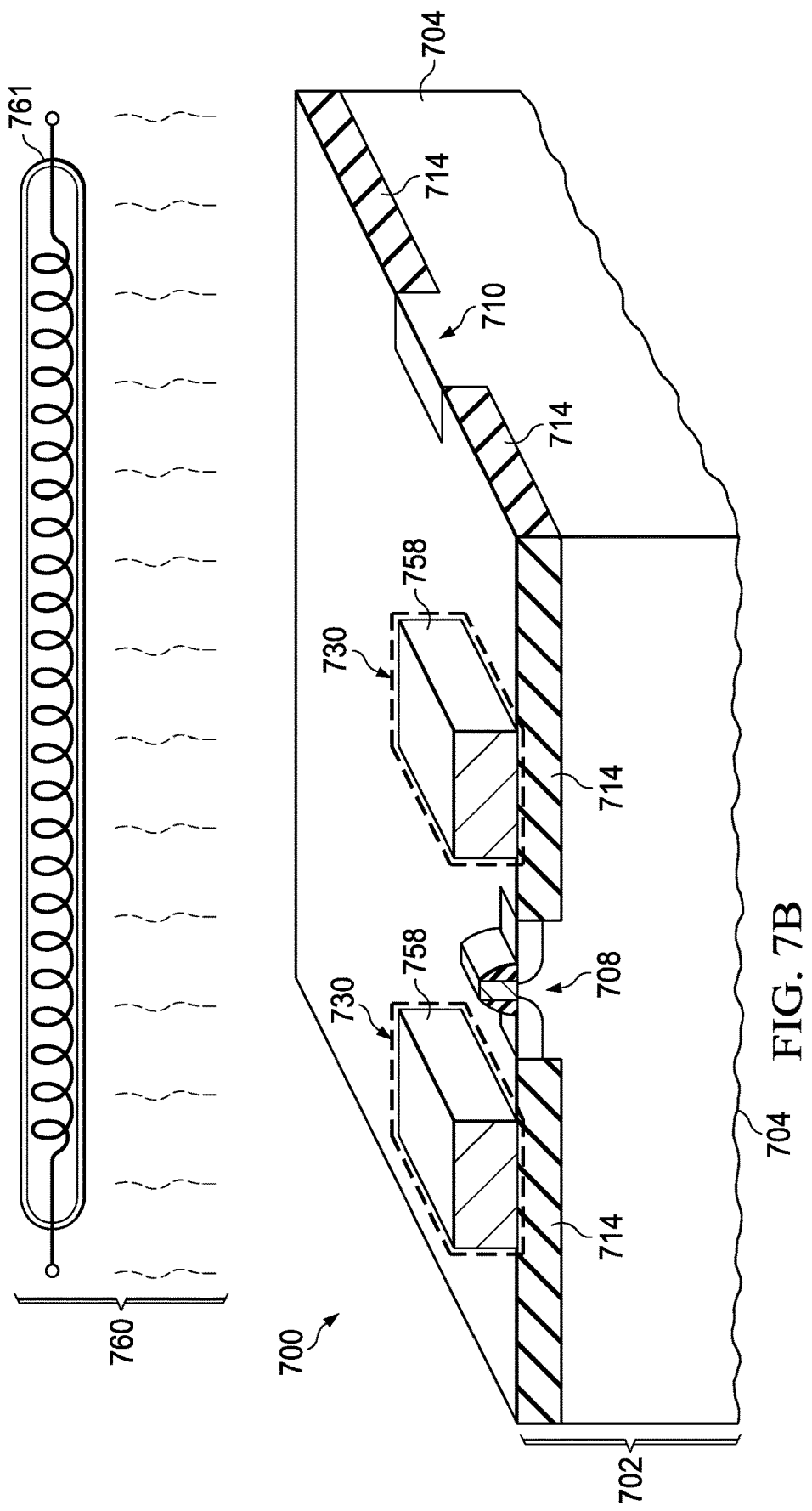

Referring to FIG. 7B, the nanoparticle ink films 756 of FIG. 7A are heated in two stages by a combination heating process 760. The first heating stage of the combination heating process 760 heats the nanoparticle ink films 756 to remove a volatile material, to form nanoparticle films which include primarily nanoparticles. The second stage of the combination heating process 760 heats the nanoparticle films to induce cohesion between the nanoparticles, to form cohered nanoparticle films 758. The combination heating process 760 may use an incandescent light source 761 as depicted schematically in FIG. 7B. The cohered nanoparticle films 758 may provide the thermal vias 730. Alternatively, additional nanoparticle ink films may be formed on the cohered nanoparticle films 758 and subsequently heated to provide the thermal vias 730.

Figure 7C:
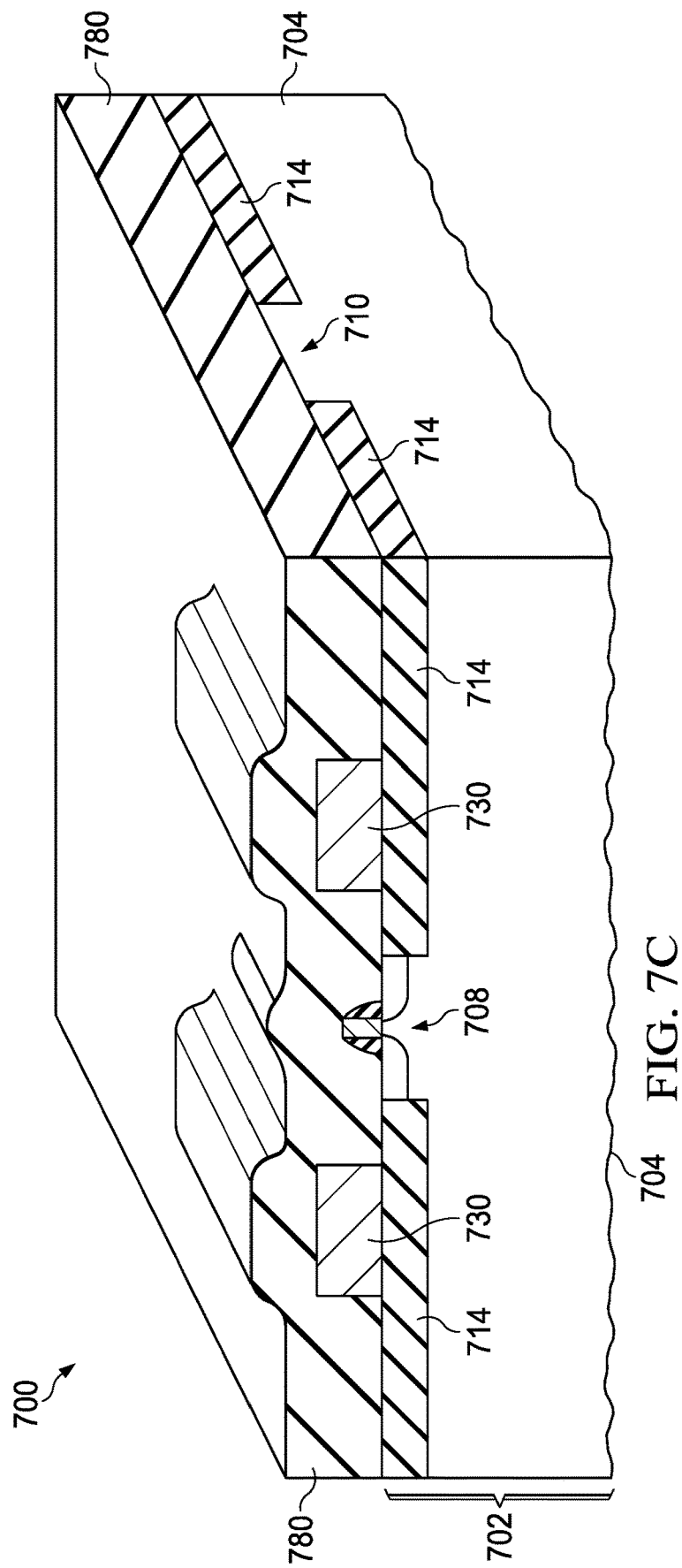

Referring to FIG. 7C, a dielectric layer 780 is formed over the instant top surface of the integrated circuit 700, including over the thermal vias 730, so that the dielectric layer 780 contacts sides of the thermal vias 730. The dielectric layer 780 may be thicker than the thermal vias 730, as indicated in FIG. 7C. The dielectric layer 780 may include one or more sub-layers, formed by sequential steps. One or more of the sub-layers may include silicon dioxide-base material such as silicon dioxide, phosphorus silicate glass (PSG), or boron phosphorus silicate glass (BPSG). Other sub-layers may include etch stop material and/or cap material such as silicon nitride and/or boron nitride. Silicon dioxide-base material in the sub-layers may be formed, for example, by a PECVD process using tetraethyl orthosilicate (TEOS), by a spin coat, bake, and anneal process using methyl silsesquioxane (MSQ), or by a high aspect ratio process (HARP) using TEOS and ozone. Silicon nitride in the sub-layers may be formed, for example, by a PECVD process using bis(tertiary-butyl-amino) silane (BTBAS), or by a low pressure chemical vapor deposition (LPCVD) process using dichlorosilane and ammonia.

Figure 7D:
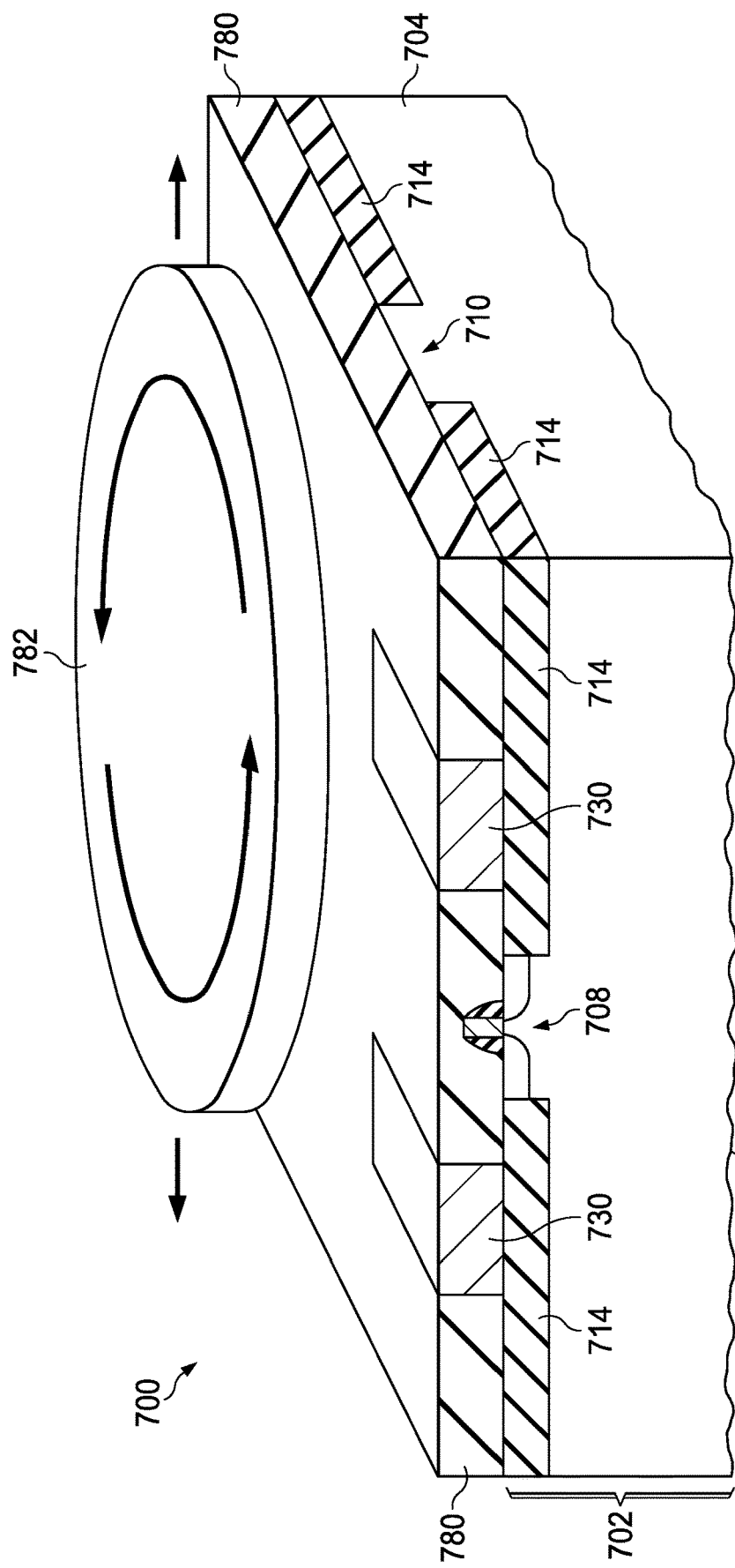

Referring to FIG. 7D, the dielectric layer 780 is planarized. The dielectric layer 780 may be planarized so as to expose the thermal vias 730, as depicted in FIG. 7D. Alternatively, some dielectric material may be left over the thermal vias 730 after the dielectric layer 780 is planarized. The dielectric layer 780 may be planarized by a chemical mechanical polish (CMP) process, as indicated in FIG. 7D by a CMP pad 782. Alternatively, the dielectric layer 780 may be planarized by a resin etchback process, in which a layer of an organic resin is formed over the dielectric layer 780 by a spin coat process so as to have a substantially planar top surface. A plasma etch process with substantially equal etch rates of the resin and the dielectric layer 780 is performed, removing the resin and leaving the dielectric layer 780 planarized. The dielectric layer 780 may provide a PMD layer for the integrated circuit. The method disclosed in the instant example enables forming the thermal vias 730 without a photolithographic step, which may advantageously reduce a fabrication cost of the integrated circuit 700. Formation of the integrated circuit 700 continues with formation of IMD layers and ILD layers, and interconnects and vias. Additional thermal vias may be formed in the ILD layers.

Figure 8:
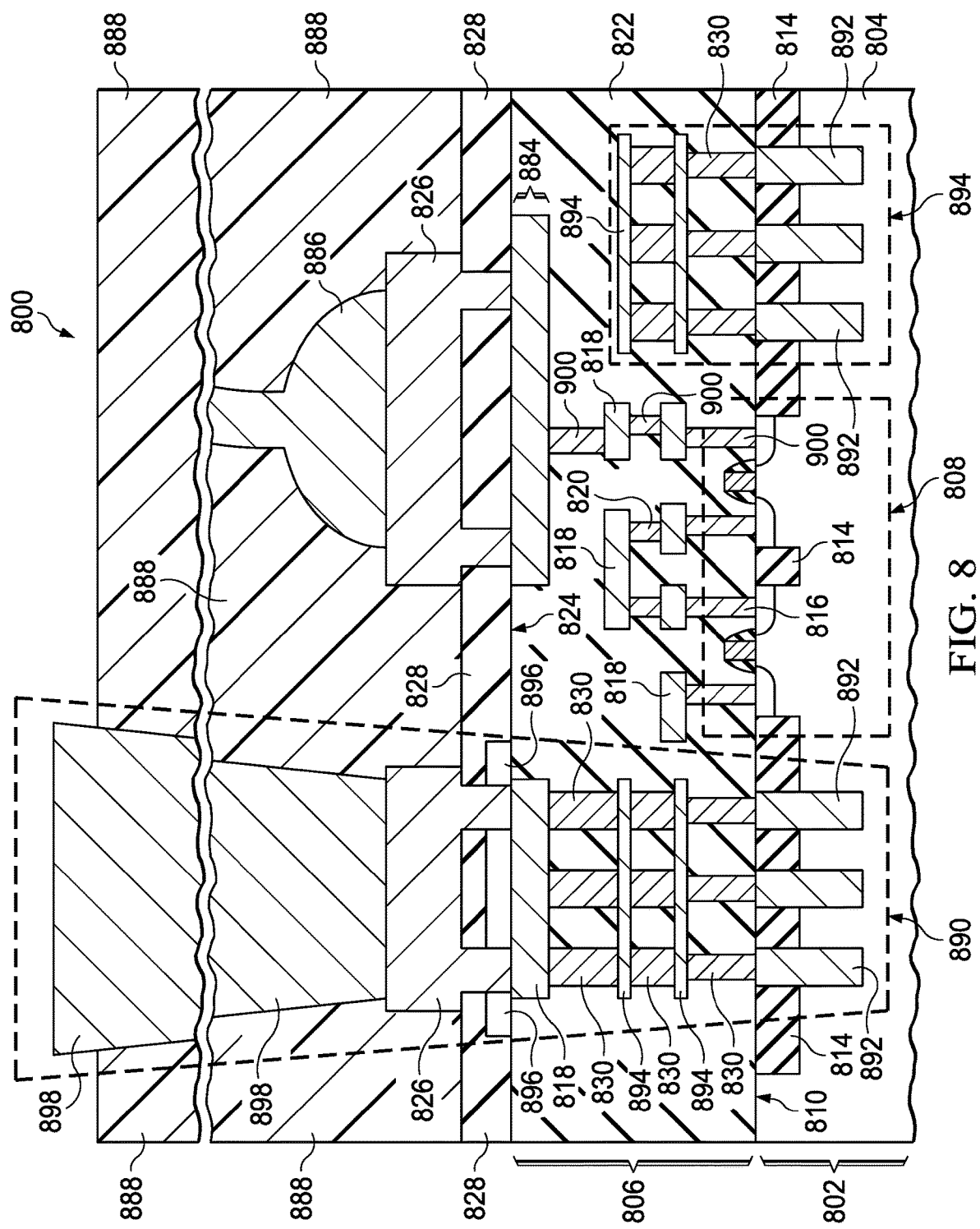
FIG. 8 is a cross section of an example integrated circuit which includes a combined thermal routing structure according to an embodiment of the invention.

FIG. 8 is a cross section of an example integrated circuit which includes a combined thermal routing structure according to an embodiment of the invention. The integrated circuit 800 includes a substrate 802 including a semiconductor material 804. The integrated circuit 800 further includes an interconnect region 806 disposed above the substrate 802. Heat-generating components 808 are disposed in the substrate 802 and the interconnect region 806, proximate to a boundary 810 between the substrate 802 and the interconnect region 806. The heat-generating components 808 may be, for example, MOS transistors, bipolar junction transistors, JFETs, resistors, and/or SCRs. The heat-generating components 808 may be laterally separated by field oxide 814 proximate to the boundary 810 between the substrate 802 and the interconnect region 806. The interconnect region 806 may include contacts 816, interconnects 818 and vias 820 disposed in a dielectric layer stack 822. Some of the interconnects 818 are disposed in a top interconnect level 884 which is located proximate to a top surface 824 of the interconnect region 806. The top surface 824 of the interconnect region 806 is located opposite from the boundary 810 between the substrate 802 and the interconnect region 806. Bond pad structures 826 are disposed over the top surface 824 of the interconnect region 806, and are electrically coupled to the interconnects 818 in the top interconnect level 884. A protective overcoat 828 is disposed over the top surface 824 of the interconnect region 806.

In the instant example, the integrated circuit 800 may be assembled using wire bonds 886 on some of the bond pad structures 826. The integrated circuit 800 is packaged by encapsulation in an encapsulation material 888. The encapsulation material 888, which may be an epoxy for example, is disposed over the protective overcoat 828 and the bond pad structures 826.

The integrated circuit 800 of the instant example includes the combined thermal routing structure 890, which extends from inside the substrate 802 through the interconnect region 806, and through the organic polymer encapsulation material 888. The combined thermal routing structure 890 may conduct heat generated by the components 808 to a heat removal apparatus, such as a heat sink, located outside of a package containing the integrated circuit 800, which may advantageously reduce an operating temperature of the components 808. The combined thermal routing structure 890 includes a plurality of thermal vias 830 disposed in the interconnect region 806 according to any of the examples disclosed herein.

The combined thermal routing structure 890 may include a thermal routing trench 892 disposed in the substrate 802. The thermal routing trench 892 may surround a portion of the components 808 and may be connected to each other at locations out of the plane of FIG. 8. The thermal routing trench 892 may have a structure and may be formed, for example, as described in the commonly assigned patent application Ser. No. 15/361,397, filed simultaneously with this application, and which is incorporated herein by reference.

The combined thermal routing structure 890 may include an interconnect region thermal routing structure 894 disposed in the interconnect region 806. The interconnect region thermal routing structure 894 may surround a portion of the components 808 and may be connected to each other at locations out of the plane of FIG. 8. The interconnect region thermal routing structure 894 may have a structure and may be formed, for example, as described in the commonly assigned patent application Ser. No. 15/361,394, filed simultaneously with this application, and which is incorporated herein by reference.

The combined thermal routing structure 890 may include a top level thermal conductivity structure 896 disposed above the top interconnect level 884. The high thermal conductivity structure 896 may have a structure and may be formed, for example, as described in the commonly assigned patent application Ser. No. 15/361,390, filed simultaneously with this application, and which is incorporated herein by reference.

The combined thermal routing structure 890 may include high thermal conductivity through-package conduits 898 disposed through the encapsulation material 888 to the integrated circuit 800. The high thermal conductivity through-package conduits 898 may have structures and may be formed, for example, as described in the commonly assigned patent application Ser. No. 15/361,403, filed simultaneously with this application, and which is incorporated herein by reference.

The integrated circuit 800 may further include graphitic vias 900 which are electrically coupled to the components 808. The graphitic vias 900 may conduct heat generated by the components 808 away from the substrate, possibly to the combined thermal routing structure 890, which may advantageously reduce an operating temperature of the components 808. The graphitic vias 900 may have structures and may be formed, for example, as described in the commonly assigned patent application Ser. No. 15/361,401, filed simultaneously with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate comprising semiconductor material;
an interconnect region disposed above the substrate, the interconnect region comprising a dielectric layer stack comprising dielectric materials;
a component disposed in the substrate and configured to generate heat when operating; and
a thermal via disposed in the interconnect region and landing on a field oxide region formed in the substrate, wherein the thermal via includes a cohered nanoparticle film which includes primarily nanoparticles, wherein each nanoparticle of a plurality of the nanoparticles is attached directly to an adjacent one of the nanoparticles, wherein the thermal via has a thermal conductivity higher than dielectric materials touching the thermal via.

2. The integrated circuit of claim 1, wherein the cohered nanoparticle film comprises electrically non-conductive nanoparticles of a material selected from the group consisting of aluminum oxide, diamond, hexagonal boron nitride, cubic boron nitride, and aluminum nitride.

3. The integrated circuit of claim 1, wherein the cohered nanoparticle film comprises electrically conductive nanoparticles of a material selected from the group consisting of metal, graphene, graphene embedded in metal, graphite, graphitic carbon, and carbon nanotubes.

4. The integrated circuit of claim 1, wherein the cohered nanoparticle film comprises nanoparticles which include a metal selected from the group consisting of copper, nickel, palladium, platinum, iridium, rhodium, cerium, osmium, molybdenum and/or gold, and wherein the thermal via comprises a layer of graphitic material disposed on the cohered nanoparticle film.

5. The integrated circuit of claim 1, wherein the thermal via is a first thermal via and further comprising a second thermal via disposed in the interconnect region above the first thermal via, wherein the second thermal via includes a cohered nanoparticle film that includes nanoparticles each attached to multiple adjacent nanoparticles, and wherein the second thermal via has a thermal conductivity higher than dielectric materials touching the second thermal via.

6. The integrated circuit of claim 5, wherein the second thermal via contacts the first thermal via.

7. The integrated circuit of claim 5, further comprising a non-circuit interconnect disposed between the first thermal via and the second thermal via, wherein the second thermal via contacts the non-circuit interconnect and the first thermal via contacts the non-circuit interconnect.

8. The integrated circuit of claim 1, wherein the thermal via contacts a first interconnect and a second interconnect, the first interconnect being electrically isolated from the second interconnect.

9. The integrated circuit of claim 1, wherein the thermal via extends proximate to matching components of the integrated circuit.

10. The integrated circuit of claim 1, wherein each one of the nanoparticles is attached to at least one nanoparticle above and at least one nanoparticle below said each one with respect to a top surface of the substrate.

11. The integrated circuit of claim 1, wherein the thermal via lands on a field oxide includes a shallow trench isolation structure or a local-oxidation of silicon structure.

12. An integrated circuit, comprising:
a substrate comprising semiconductor material;
an interconnect region disposed above the substrate, the interconnect region comprising a dielectric layer stack comprising dielectric materials;
a component disposed in the substrate and configured to generate heat when operating; and
a thermal via disposed in the interconnect region and landing on a field oxide region that extends below a surface of the substrate, wherein the thermal via is partially filled with a cohered nanoparticle film that includes primarily nanoparticles each attached directly to multiple adjacent ones of the nanoparticles, and a remaining portion of the thermal via is filled with a graphitic layer over the cohered nanoparticle film.

13. The integrated circuit of claim 12, wherein the cohered nanoparticle film comprises electrically non-conductive nanoparticles of a material selected from the group consisting of aluminum oxide, diamond, hexagonal boron nitride, cubic boron nitride, and aluminum nitride.

14. The integrated circuit of claim 12, wherein the cohered nanoparticle film comprises electrically conductive nanoparticles of a material selected from the group consisting of metal, graphene, graphene embedded in metal, graphite, graphitic carbon, and carbon nanotubes.

15. The integrated circuit of claim 12, wherein the cohered nanoparticle film comprises nanoparticles which include a metal selected from the group consisting of copper, nickel, palladium, platinum, iridium, rhodium, cerium, osmium, molybdenum and/or gold, and wherein the thermal via comprises a layer of graphitic material disposed on the cohered nanoparticle film.

16. The integrated circuit of claim 12, wherein the thermal via contacts a first interconnect and a second interconnect, the first interconnect being electrically isolated from the second interconnect.

17. The integrated circuit of claim 12, wherein the field oxide region includes a shallow trench isolation structure or a local-oxidation of silicon structure.

18. An integrated circuit, comprising:
a substrate comprising semiconductor material;
an interconnect region disposed above the substrate, the interconnect region comprising a dielectric layer stack comprising dielectric materials;
a component disposed in the substrate and configured to generate heat when operating; and
a thermal via disposed in the interconnect region and landing on a field oxide region formed over the substrate, wherein the thermal via is substantially filled with nanoparticles.

19. The integrated circuit of claim 18, wherein the nanoparticles comprise electrically non-conductive nanoparticles of a material selected from the group consisting of aluminum oxide, diamond, hexagonal boron nitride, cubic boron nitride, and aluminum nitride.

20. The integrated circuit of claim 18, wherein the nanoparticles comprise electrically conductive nanoparticles of a material selected from the group consisting of metal, graphene, graphene embedded in metal, graphite, graphitic carbon, and carbon nanotubes.

21. The integrated circuit of claim 18, wherein the nanoparticles comprise nanoparticles that include a metal selected from the group consisting of copper, nickel, palladium, platinum, iridium, rhodium, cerium, osmium, molybdenum and/or gold, and wherein the thermal via comprises a layer of graphitic material disposed on the nanoparticles.

22. The integrated circuit of claim 18, wherein the thermal via is a first thermal via and further comprising a second thermal via disposed in the interconnect region above the first thermal via, wherein the second thermal via includes a cohered nanoparticle film in which adjacent nanoparticles are attached to each other, and wherein the second thermal via has a thermal conductivity higher than dielectric materials touching the second thermal via.

23. The integrated circuit of claim 18, wherein the thermal via extends proximate to matching components of the integrated circuit.

24. The integrated circuit of claim 18, wherein the field oxide region includes a shallow trench isolation structure or a local-oxidation of silicon structure.

\* \* \* \* \*